(12) United States Patent
Itou et al.

(10) Patent No.: US 6,269,038 B1
(45) Date of Patent: Jul. 31, 2001

(54) SEMICONDUCTOR MEMORY DEVICE WITH TEST MODE DECISION CIRCUIT

(75) Inventors: Takashi Itou; Yasuhiko Tsukikawa; Kengo Aritomi; Mikio Asakura, all of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/556,290

(22) Filed: Apr. 24, 2000

(30) Foreign Application Priority Data

Oct. 29, 1999 (JP) .................................................. 11-309668

(51) Int. Cl.$^7$ .................................................. G11C 7/00
(52) U.S. Cl. .......................................... 365/201; 365/222
(58) Field of Search ............................... 365/201, 230.06, 365/222

(56) References Cited

U.S. PATENT DOCUMENTS 5,400,290  3/1995  Suma et al. .......................... 365/226
5,999,480 * 12/1999  Ong et al. .......................... 365/230.06

FOREIGN PATENT DOCUMENTS 5-242698   9/1993  (JP) .
6-194424   7/1994  (JP) .
10-247399  9/1998  (JP) .

* cited by examiner

Primary Examiner—David Nelms
Assistant Examiner—M. Tran
(74) Attorney, Agent, or Firm—McDermott, Will & Emery

(57) ABSTRACT

There is provided a test mode decision circuit which in the first WCBR cycle responds to an address key by activating a test mode entry signal and with the test mode entry signal activated in the second WCBR cycle responds to an address key by selectively activating test mode signals. In addition to a test mode signal having been activated, the test mode decision circuit further activates another test mode signal. Thus the DRAM hardly enter a test mode erroneously and is also capable of entering more than one test mode simultaneously.

8 Claims, 20 Drawing Sheets

SEMICONDUCTOR MEMORY DEVICE WITH TEST MODE DECISION CIRCUIT

BACKGROUND OF THE INVENTION

1. Field of the Invention

The present invention relates to semiconductor memory devices and particularly to an improvement of a test mode decision circuit in a dynamic random access memory (DRAM).

2. Description of the Background Art

DRAMs in general have more than one test mode. A DRAM enters a test mode when a test mode decision circuit provided in the DRAM detects the test mode. To prevent the DRAM from erroneously entering the test mode when an ordinary user is normally using the DRAM, the test mode decision circuit is configured to detect a super VIH level higher than a logical high level that is applied to an address pin in a WCBR (WE (a write enable signal), CAS (a column address strobe signal) and BEFORE RAS (a row address strobe signal)) cycle.

However, conventional DRAMs cannot enter more than one test mode simultaneously. In contrast, Japanese Patent Laying-Open No. 5-242698 discloses a DRAM capable of entering more than one test mode simultaneously. Once it has entered a test mode, however, the DRAM cannot enter another test mode. As such, the DRAM must first exit the test mode and thereafter enter two test modes simultaneously.

Furthermore, in a conventional DRAM a refresh operation is performed whenever the DRAM enters a test mode. As such, in the DRAM the refresh operation is performed when the DRAM already in a test mode also enters another test mode, so that the first test cannot be run accurately.

Furthermore, a DRAM can erroneously enter a test mode when the write enable signal, the column address strobe signal and the row address strobe signal are erroneously input in the WCBR cycle and the address pin also receives a high-voltage noise.

Japanese Patent Laying-Open No. 10-247399 discloses a DRAM which allows three different password signals to be input in three WCBR cycles and stored in a register and in the fourth WCBR cycle responds to an input address by entering a predetermined test mode. This DRAM, however, cannot enter more than one test mode simultaneously.

SUMMARY OF THE INVENTION

The present invention contemplates a semiconductor memory device prevented from erroneously entering a test mode.

In accordance with the present invention, a semiconductor memory device having a memory cell array includes a test mode decision circuit and a plurality of test control circuits. The test mode decision circuit activates a test mode entry signal in response to an address key when a write enable signal and a column address strobe signal are activated before a row address strobe signal is activated, and the test mode decision circuit selectively activates a plurality of test mode signals in response to an address key when with the test mode entry signal activated the write enable signal and the column address strobe signal are activated before the row address strobe signal is activated. The plurality of test control circuits are associated with a plurality of test mode signals. Each test control circuit responds to an associated test mode signal to run a predetermined test for the semiconductor memory device.

Preferably the test mode decision circuit activates one of the test mode signals and while continuously activating the test mode signal the test mode decision circuit also activates another test mode signal.

Preferably the semiconductor memory device also includes refresh means including refresh means refreshing the memory cell array when with the test mode entry signal inactivated the write enable signal and the column address strobe signal are activated before the row address strobe signal is activated.

Thus in accordance with the present invention it is not until the second WCBR cycle that the test mode decision circuit responds to an address key to activate a test mode. Thus the semiconductor memory device is less likely to erroneously enter a test mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
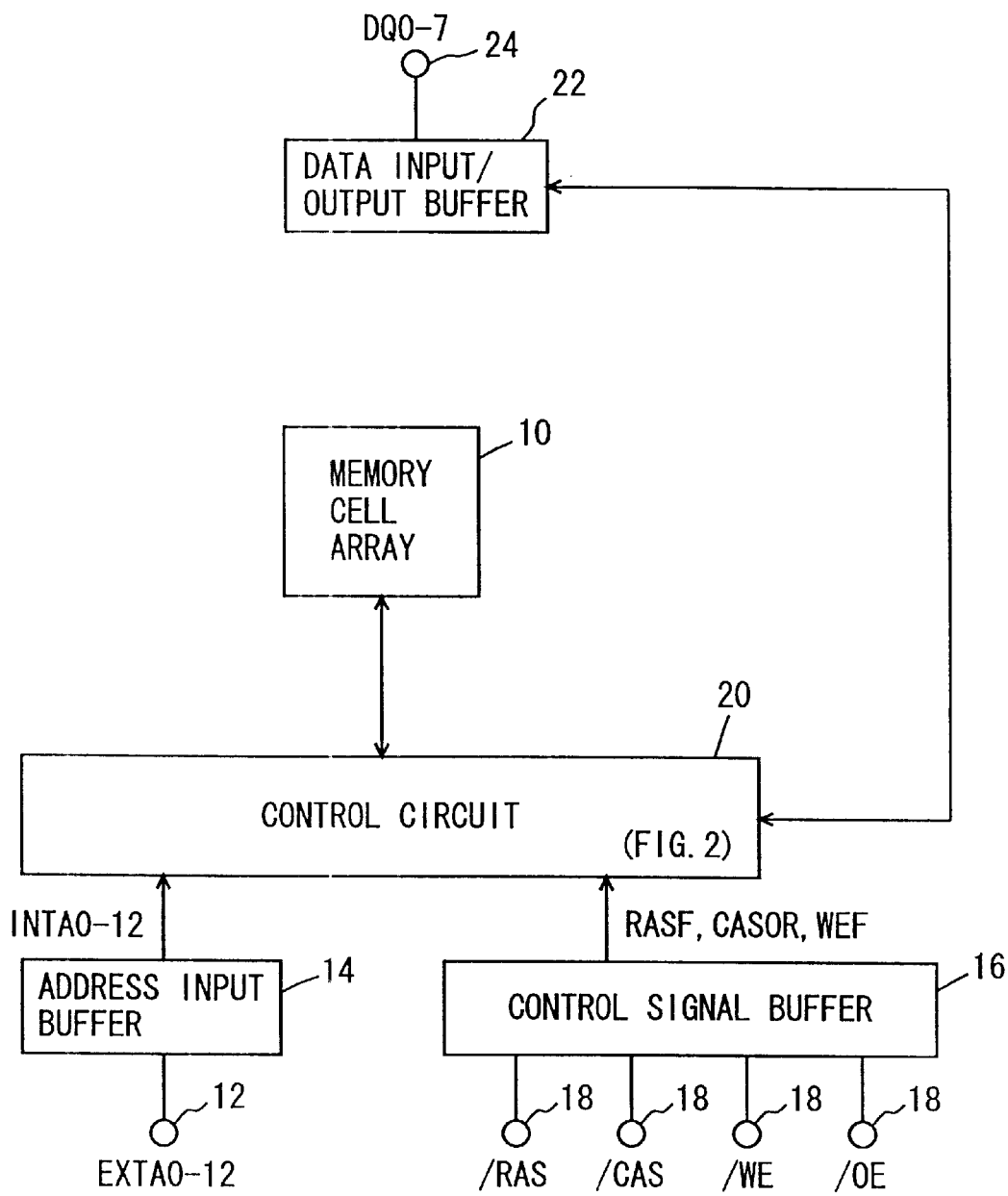
FIG. 1 is a block diagram generally showing a configuration of a DRAM according to an embodiment of the present invention.

The embodiments of the present invention will now be described more specifically with reference to the drawings. In the figures identical or corresponding portions are denoted by same reference characters and a description thereof will not be repeated.

Referring to FIG. 1, a DRAM according to an embodiment of the present invention includes a 64-mega bit memory cell array 10, an address input buffer 14 responding to external address signals EXTA0–EXTA12 applied via 13 address pins 12 by producing internal address signals INTA0–INTA12, a control signal buffer 16 responding to an external row address strobe signal /RAS, an external column address strobe signal /CAS, an external write enable signal /WE and an external output enable signal /OE applied via control pins 18 by producing an internal row address strobe signal RASF, an internal column address strobe signal CASOR, an internal write enable signal WEF and other signals, a control circuit 20 responding to internal address signals INTA0–INTA12 and internal control signals RASF, CASOR, WEF by controlling memory cell array 10 to allow data to be read from and written to memory cell array 10, and an input/output buffer 22 outputting via a data pin 24 8-bit data DQ0–DQ7 read from memory cell array 10 and receiving via data pin 24 data DQ0–DQ7 to be written to memory cell array 10.

The DRAM has a "×8" configuration, capable of inputting/outputting 8 data DQ0–DQ7 simultaneously. Furthermore, the DRAM is an 8-K product and in the normal operation a row address, using internal address signals INTA0–INTA12, is eight kilo bits, although it should be noted that in a CBR (CAS before RAS) refresh operation a row address is half of it, i.e., four kilo bits.

Control circuit 20 includes a test mode decision circuit 26 detecting control signals RASF, CASOR, WEF and an address key to determine a test mode, and test control circuits 281–284 responding to test mode signals TM1–TM4 from test mode decision circuit 26 by running their respective predetermined tests for the DRAM. Test mode decision circuit 26 includes a test mode entry circuit 30 responding to an address key input in the first WCBR (WE and CAS before RAS) cycle by allowing an entry to a test mode, and a test mode set circuit 32 responding to an address key input in the second WCBR cycle by setting test mode signals TM1–TM4.

Figure 3:
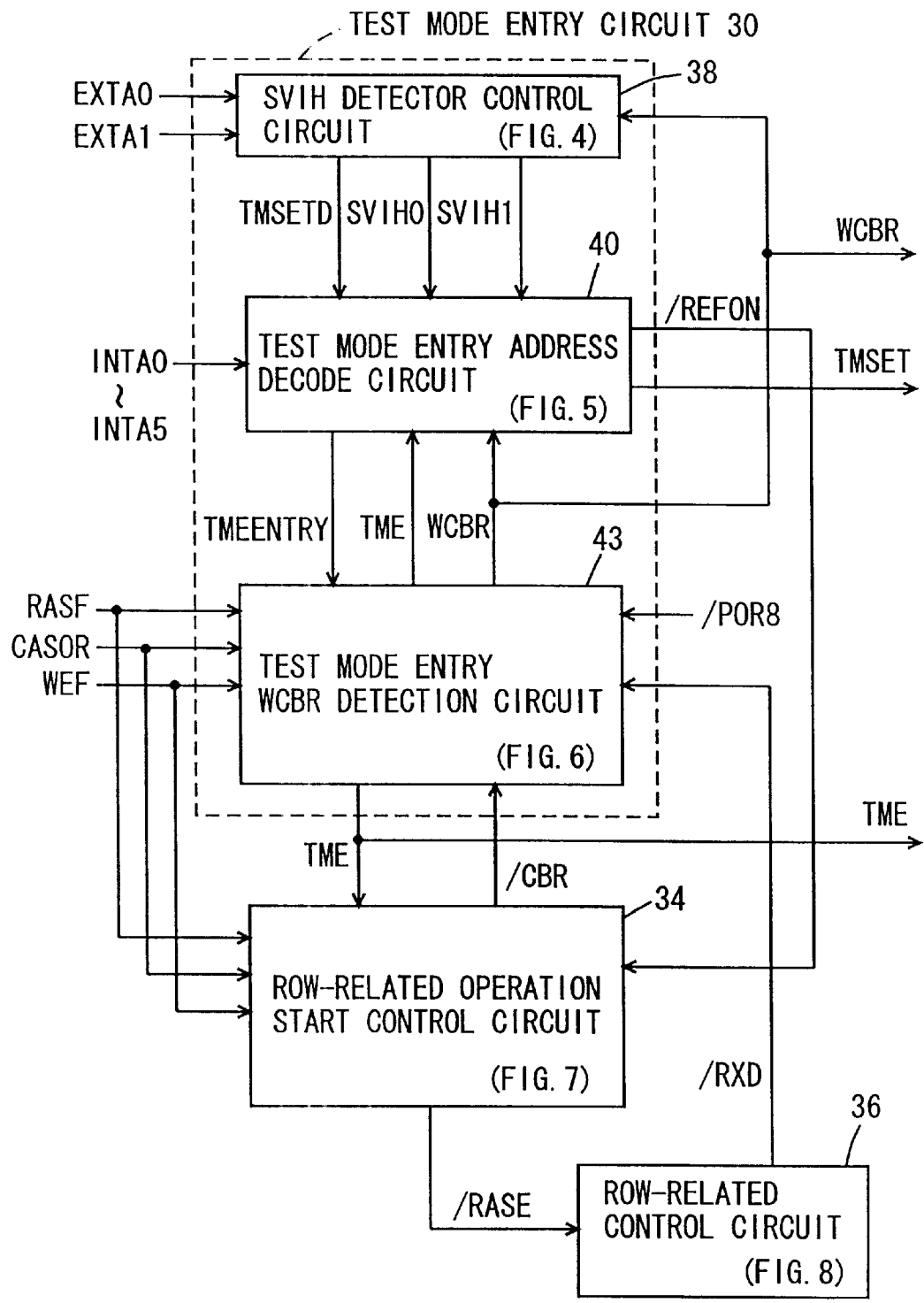
FIG. 3 is a block diagram showing a configuration of the FIG. 2 test mode entry circuit included in the FIG. 1 control circuit, a row-related operation start control circuit and a row-related control circuit.

As shown in FIG. 3, in addition to test mode entry circuit 30 the FIG. 1 control circuit 20 includes row-related operation start control circuit 34 driving low or activating a row-related operation start signal /RASE when row address strobe signal RASF goes high, and a row-related control circuit 36 responding to operation start signal /RASE by generating a sense amplifier drive signal /RXD for activating a sense amplifier.

Test mode entry circuit 30 includes an SVIH detector control circuit 38 detecting a super VIH level, a test mode entry address decode circuit 40 decoding internal address signals INTA0–INTA5 during a test mode entry period, and a test mode entry WCBR detection circuit 43 detecting the WCBR cycle.

Figure 4:
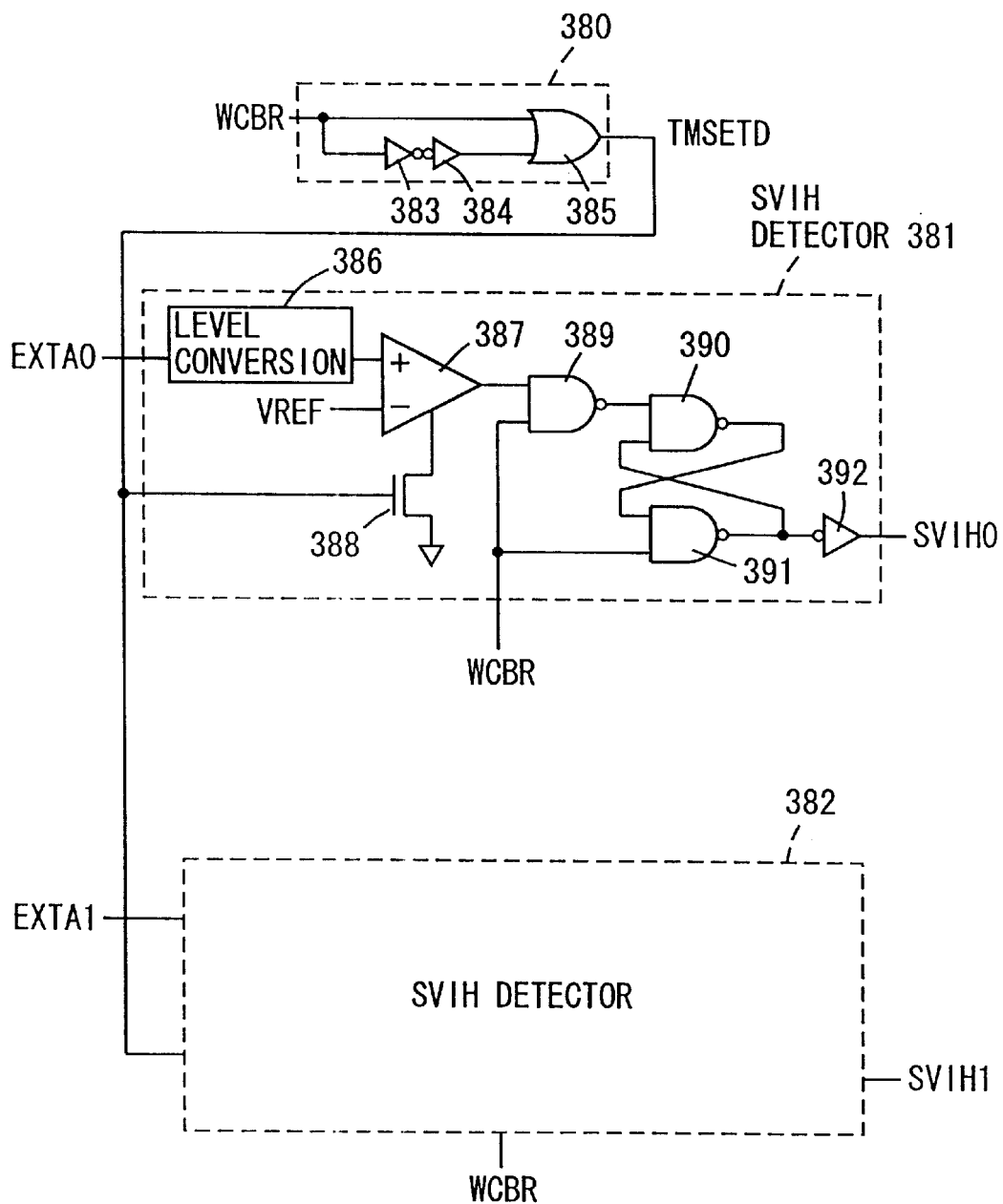
FIG. 4 is a circuit diagram showing a configuration of the FIG. 3 SVIH detector control circuit.

Referring to FIG. 4, SVIH detector control circuit 38 includes a one-shot multi-vibrator circuit 380 responding to a WCBR detection signal WCBR from test mode entry WCBR detection circuit 43 by generating a detector enable signal TMSETD, an SVIH detector 381 detecting a super VIH applied as an external address signal EXTA0 to generate a super VIH detection signal SVIH0, and an SVIH detector 382 detecting a super VIH level applied as an external address signal EXTA1 to generate a super VIH detection signal SVIH1. SVIH detector 381 includes a level converter 386, a differential amplifier 387, an n channel MOS transistor 388, NAND circuits 389–391, and an inverter circuit 392. Transistor 388 responds to the high-level detector enable signal TMSETD by turning on to supply power to differential amplifier 387. Thus SVIH detector 381 is activated in response to detector enable signal TMSETD. NAND circuits 390 and 391 configure an RS flip flop circuit. Thus, when the super VIH level is applied, super VIH detection signal SVIH0 is set high. The set, super VIH detection signal SVIH0 is reset in response to WCBR detection signal WCBR. SVIH detector 382 is similar in configuration to SVIH detector 381.

Figure 5:
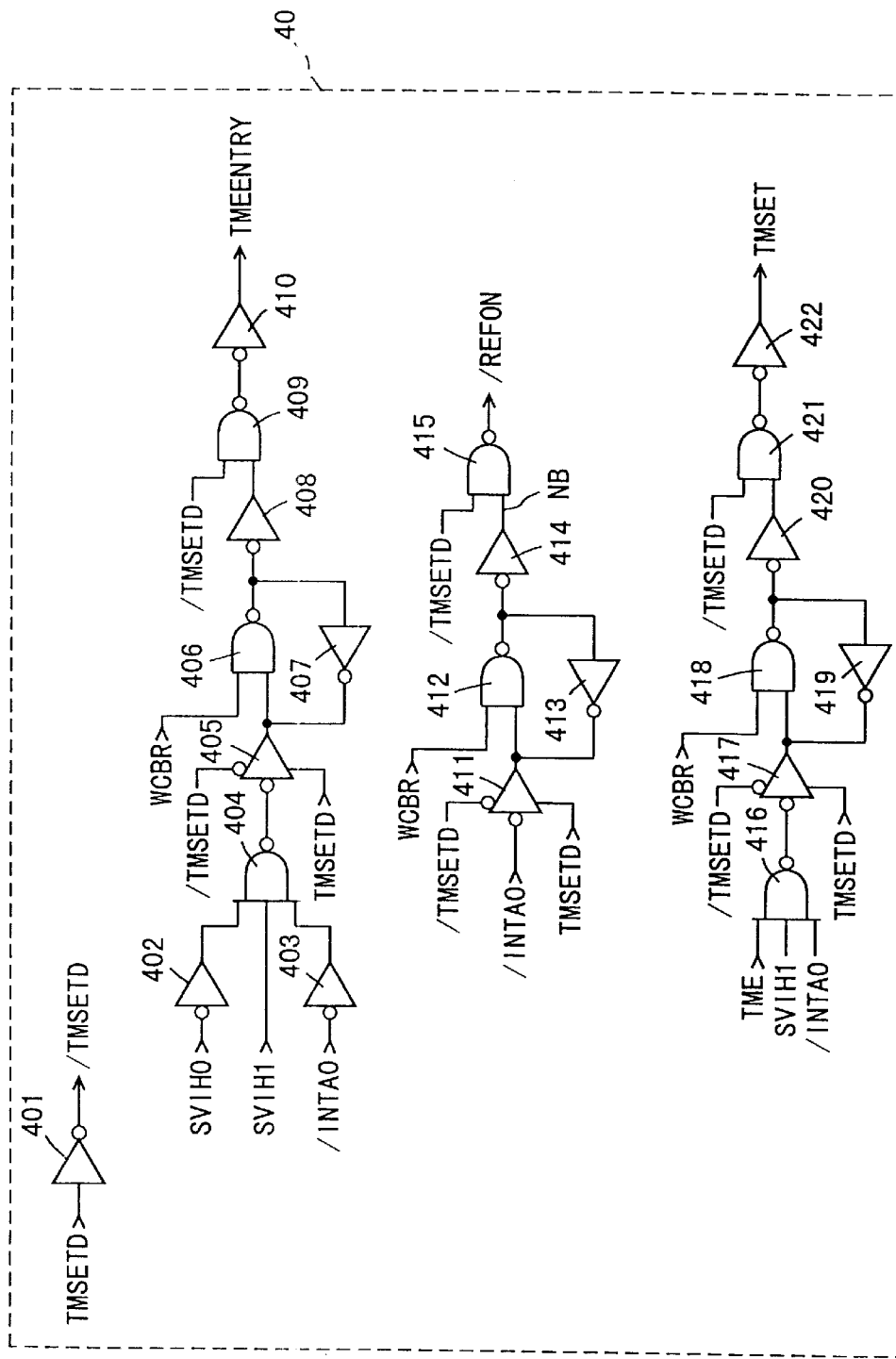
FIG. 5 is a circuit diagram showing a configuration of the FIG. 3 test mode entry address decode circuit.

Referring to FIG. 5, test mode entry address decode circuit 40 includes inverter circuits 401–403, 405, 407, 408, 410, 411, 413, 414, 417, 419, 420, 422, and NAND circuits 404, 406, 409, 412, 415, 416, 418, 421. Inverter circuit 401 responds to detector enable signal TMSETD from SVIH detector control circuit 38 by generating a detector enable signal /TMSETD complementary thereto. Inverter circuits 405, 411, 417 are activated when detector enable signal TMSETD is high and detector enable signal /TMSETD is low.

When detector enable signal /TMSETD goes high with super VIH detection signal SVIH0 and SVIH1 from detector control circuit 38 held low and high, respectively, and internal address signal INTA0 held high, a test mode entry signal TMEENTRY goes high.

Furthermore, when detector enable signal /TMSETD goes high with internal address signal INTAO held high, a refresh-on signal /REFON is driven low.

Furthermore, when detector enable signal /TMSETD goes high with a test mode entry signal TME from test mode entry WCBR detection circuit 43 held high, internal address signal INTA0 held low and super VIH detection signal SVIH1 held high, a test mode set signal TMSET goes high.

Figure 6:
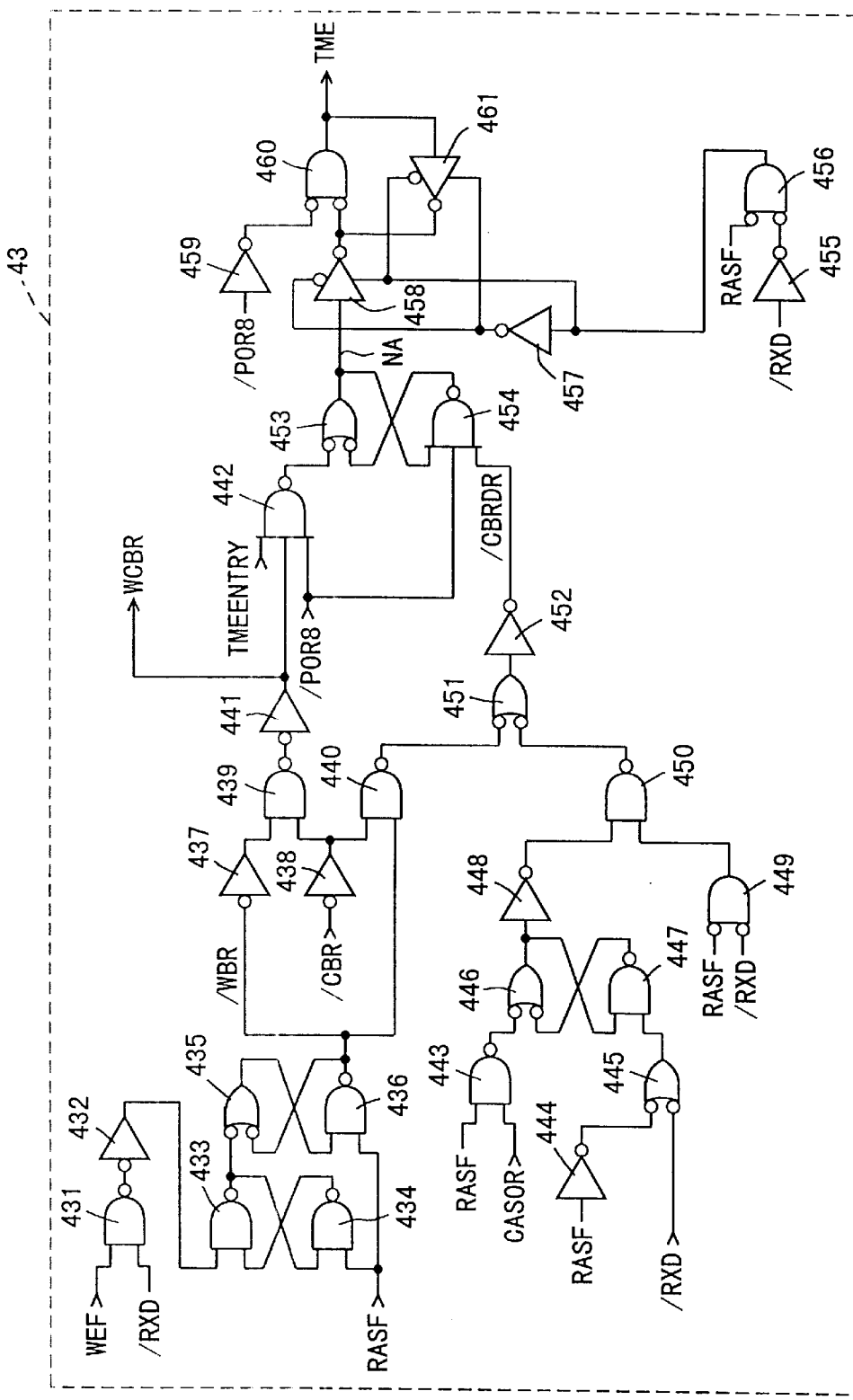
FIG. 6 is a circuit diagram showing a configuration of the FIG. 3 test mode entry WCBR detection circuit.

Referring to FIG. 6, test mode entry WCBR detection circuit 43 includes NAND circuits 431, 433–436, 439, 440, 442, 443, 445–447, 450, 451, 453, 454, inverter circuits 432, 437, 438, 441, 444, 448, 455, 457–459, 461, and NOR circuits 449, 456.

Figure 7:
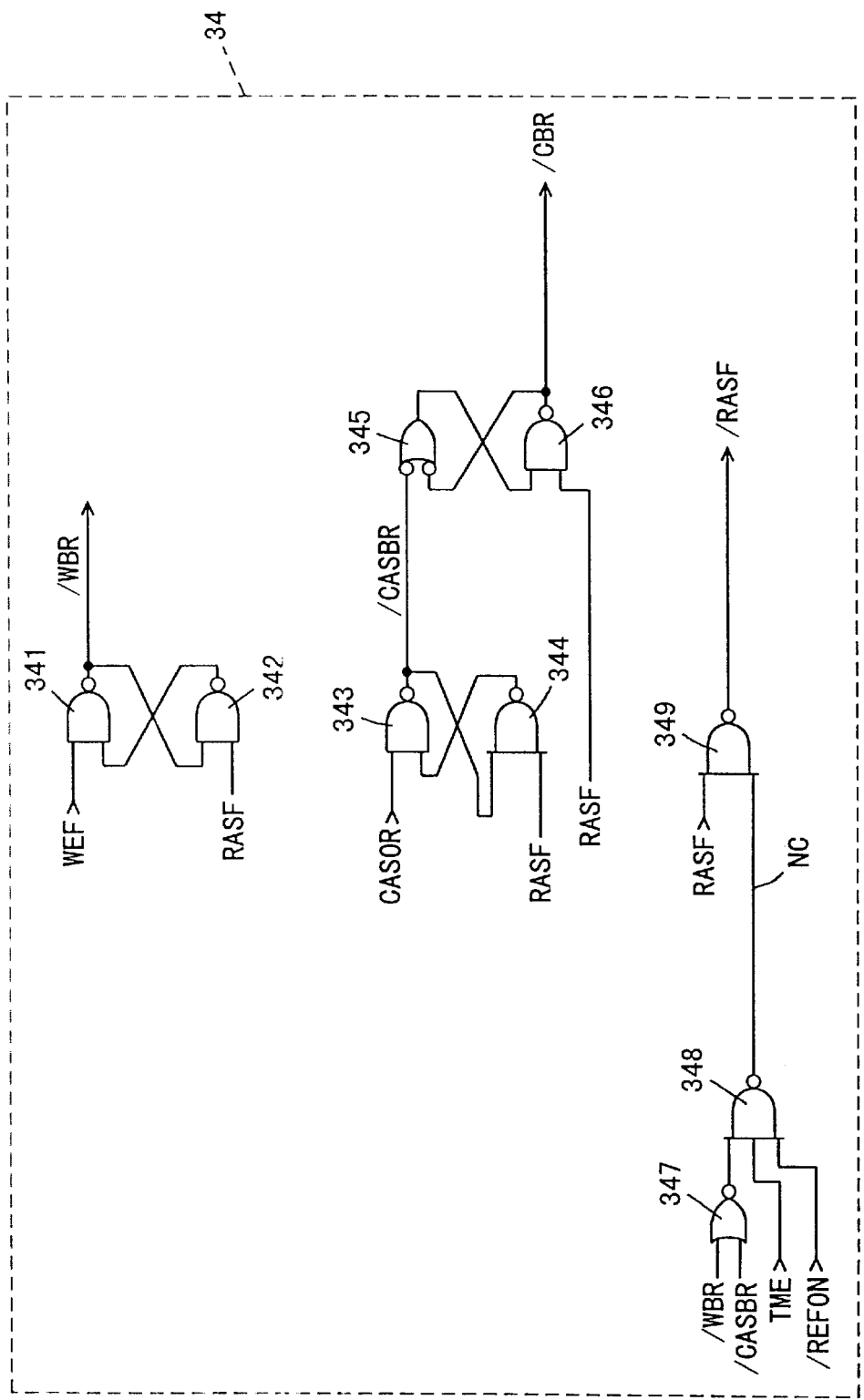
FIG. 7 is a circuit diagram showing a configuration of the FIG. 3 row-related operation start control circuit.

Referring to FIG. 7, row-related operation start control circuit 34 includes NAND circuits 341–346, 348, 349, and an NOR circuit 347. In a WBR (WE before RAS) cycle, in which write enable signal WEF is activated before row address strobe signal RASF is activated, WBR detection signal /WBR is driven low. Furthermore, in a CBR cycle, in which column address strobe signal CASOR is activated before row address strobe signal RASF is activated, a CBR detection signal /CASBR is driven low. When WBR detection signal /WBR and CBR detection signal /CASBR are both driven low, test mode entry signal TME from test mode entry WCBR circuit 43 goes high and refresh-on signal /REFON from test mode entry address decode circuit 40 goes high, then row-related operation start signal /RASE goes high and row-related control circuit 36 stops operating. When refresh-on signal /REFON is driven low, row-related operation start signal /RASE is driven low and row-related control circuit 36 starts operating.

Figure 8:
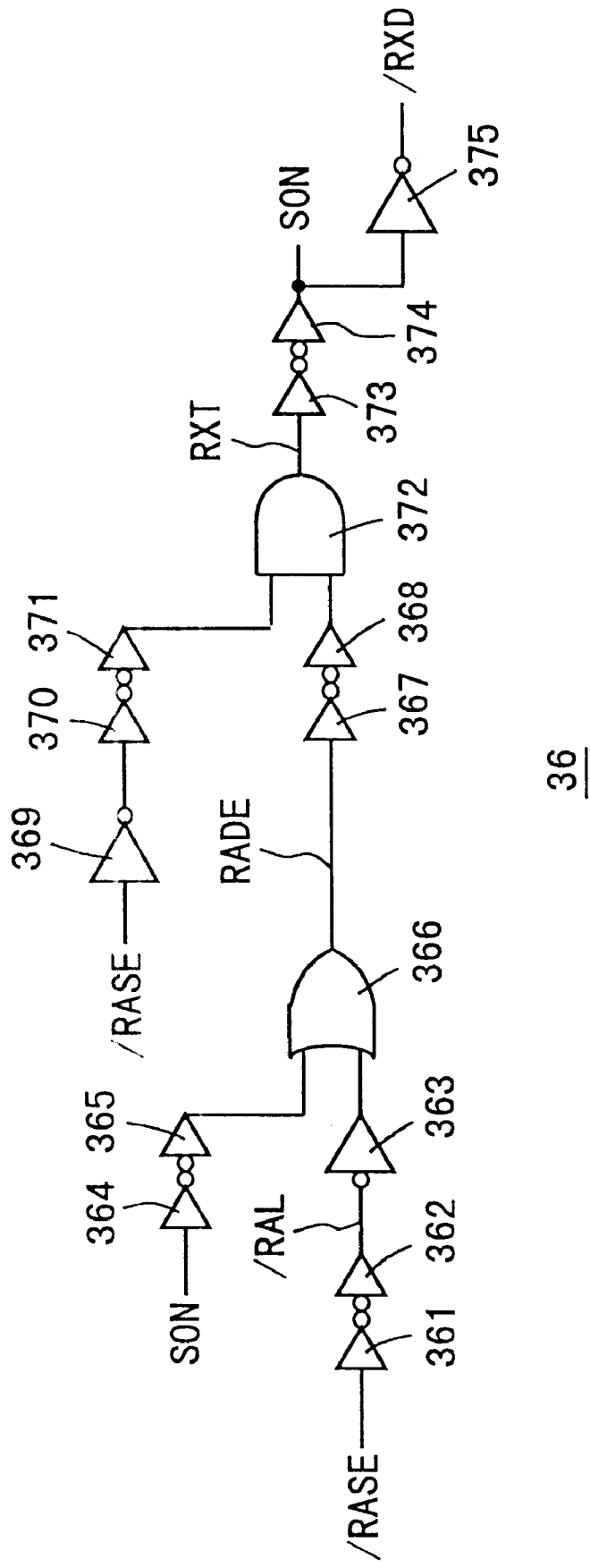
FIG. 8 is a circuit diagram showing a configuration of a row-related control circuit.

Referring to FIG. 8, row-related control circuit 36 includes inverter circuits 361–365, 367–371, 373–375, an OR circuit 366, and an AND circuit 372. Row-related operation start signal /RASE from row-related operation start control circuit 34 is fed to inverter circuits 361 and 369. Inverter circuit 362 generates a row address latch signal /RAL latching an internal row address signal. OR circuit 366 generates a row address decode enable signal RADE activating a row address decoder decoding external address signals EXTA0–12. AND circuit 372 generates a word line drive signal RXT activating a word line. Inverter circuit 374 generates a sense signal S0N activating a sense amplifier. Inverter circuit 375 generates a sense amplifier drive signal /RXD used to activate a sense amplifier.

Figure 2:
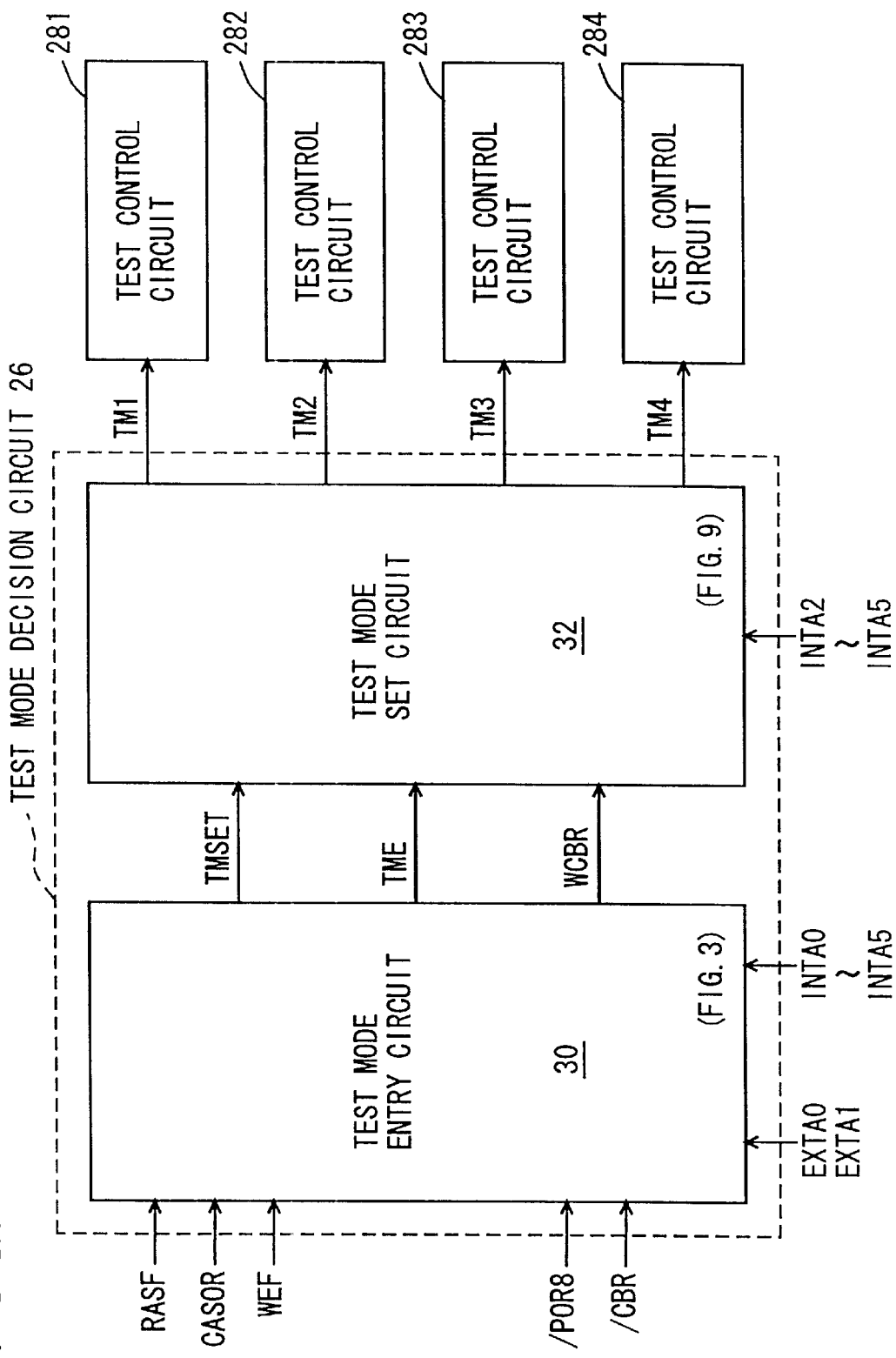
FIG. 2 is a block diagram showing a partial configuration of the FIG. 1 control circuit.
Figure 9:
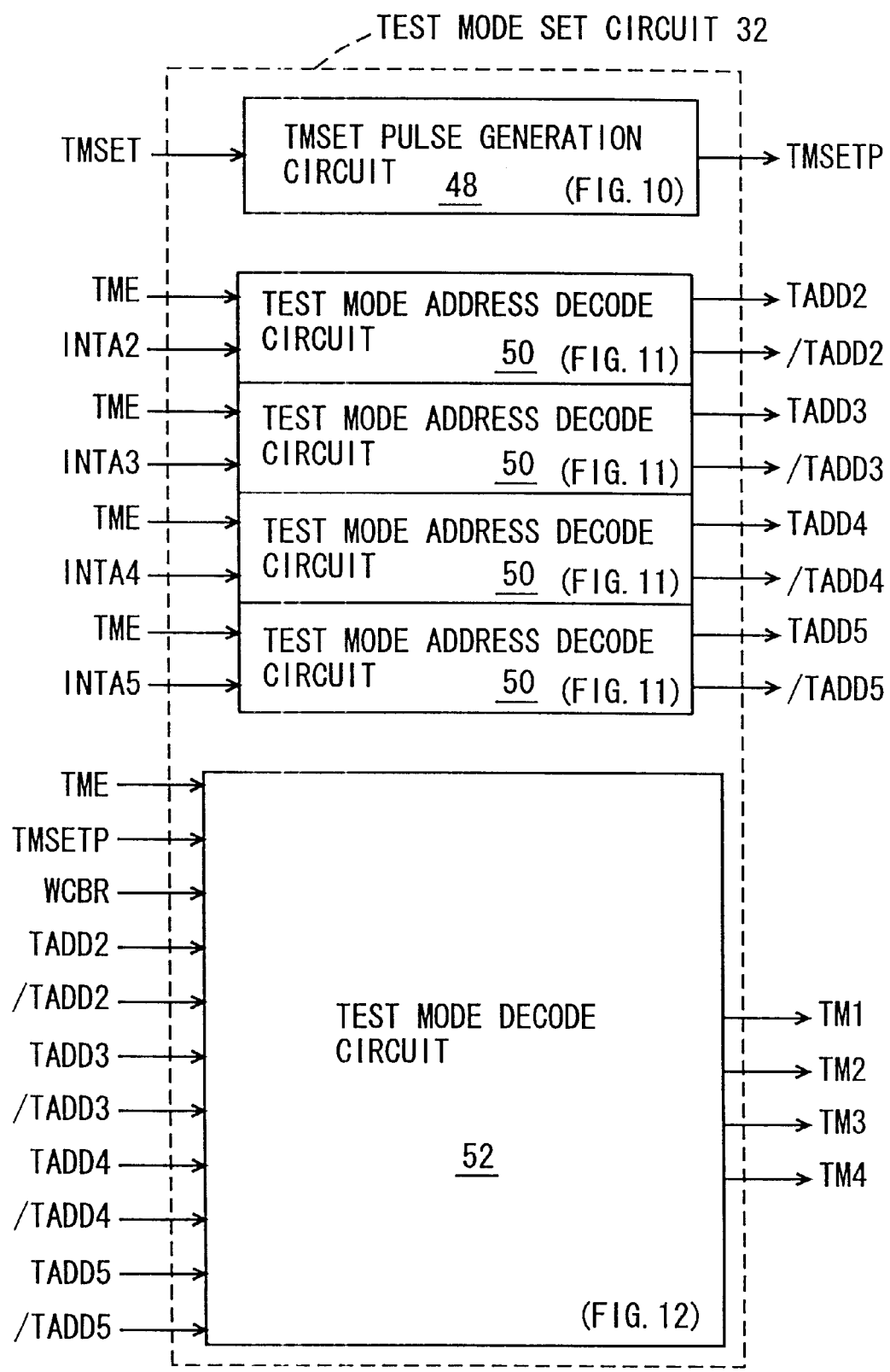
FIG. 9 is a block diagram showing a configuration of the FIG. 2 test mode set circuit.

Referring to FIG. 9, the FIG. 2 test mode set circuit 32 includes a test mode setting pulse generation circuit 48, four test mode address decode circuits 50, and a test mode decode circuit 52.

Figure 10:
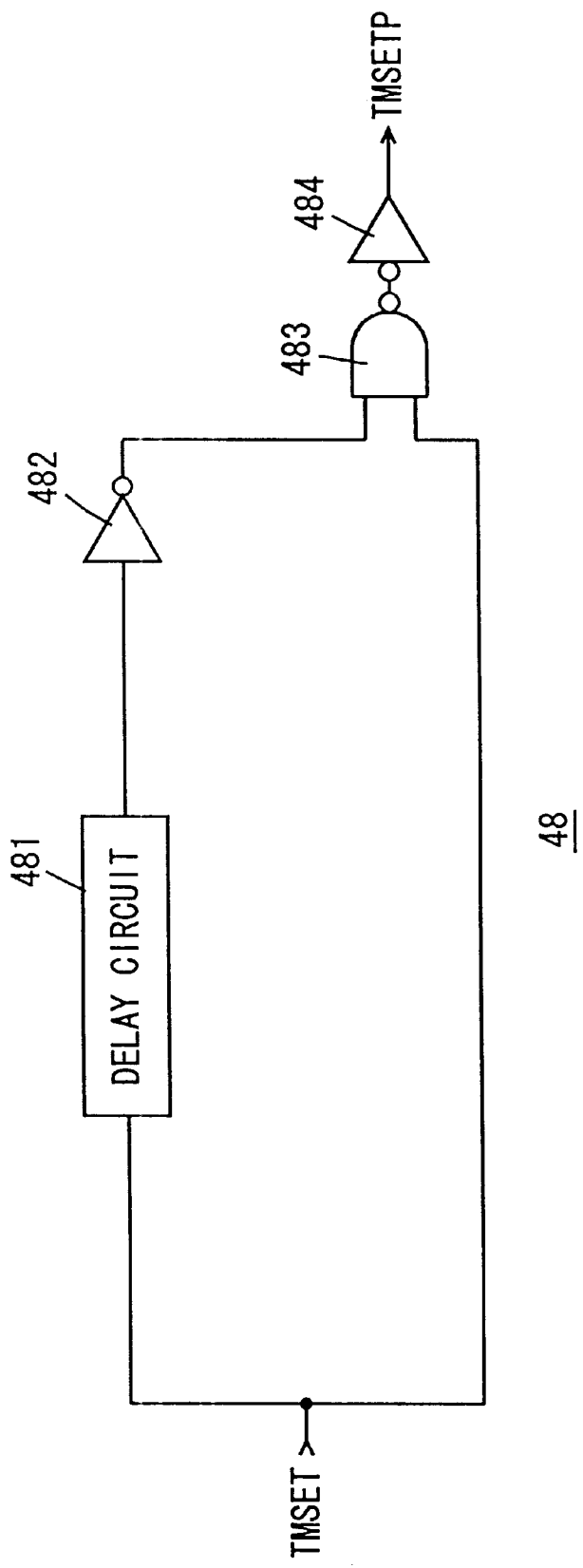
FIG. 10 is a circuit diagram showing a configuration of the FIG. 9 test mode setting pulse generation circuit.

Referring to FIG. 10, test mode setting pulse generation circuit 48 corresponds to a one-shot multi-vibrator circuit including a delay circuit 481, inverter circuits 482, 484, and an NAND circuit 483. Test mode setting pulse generation circuit 48 responds to test mode set signal TMSET from test mode entry address decode circuit 40 to generate a test mode setting pulse signal TMSETP for a predetermined period of time.

Figure 11:
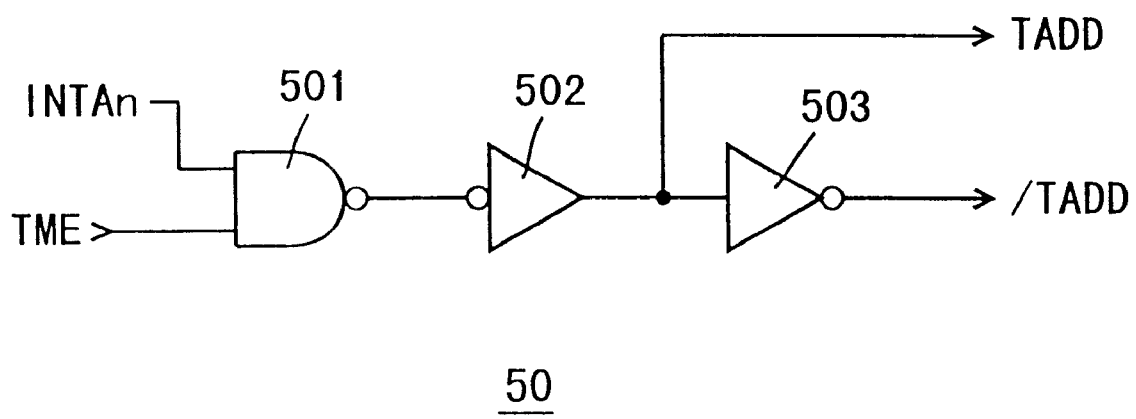
FIG. 11 is a circuit diagram showing a configuration of each test mode address decode circuit in FIG. 9.

Referring to FIG. 11, test mode address decode circuits 50 each include an NAND circuit 501 and inverter circuits 502, 503. When test mode address decode circuit 50 receives from test mode entry WCBR detection circuit 43 test mode entry signal TME set high, test mode address decode circuit 50 responds to internal address signal INTAn to produce mutually complementary test mode address decode signals TADD and /TADD, wherein n is equal to 2 to 5.

Figure 12:
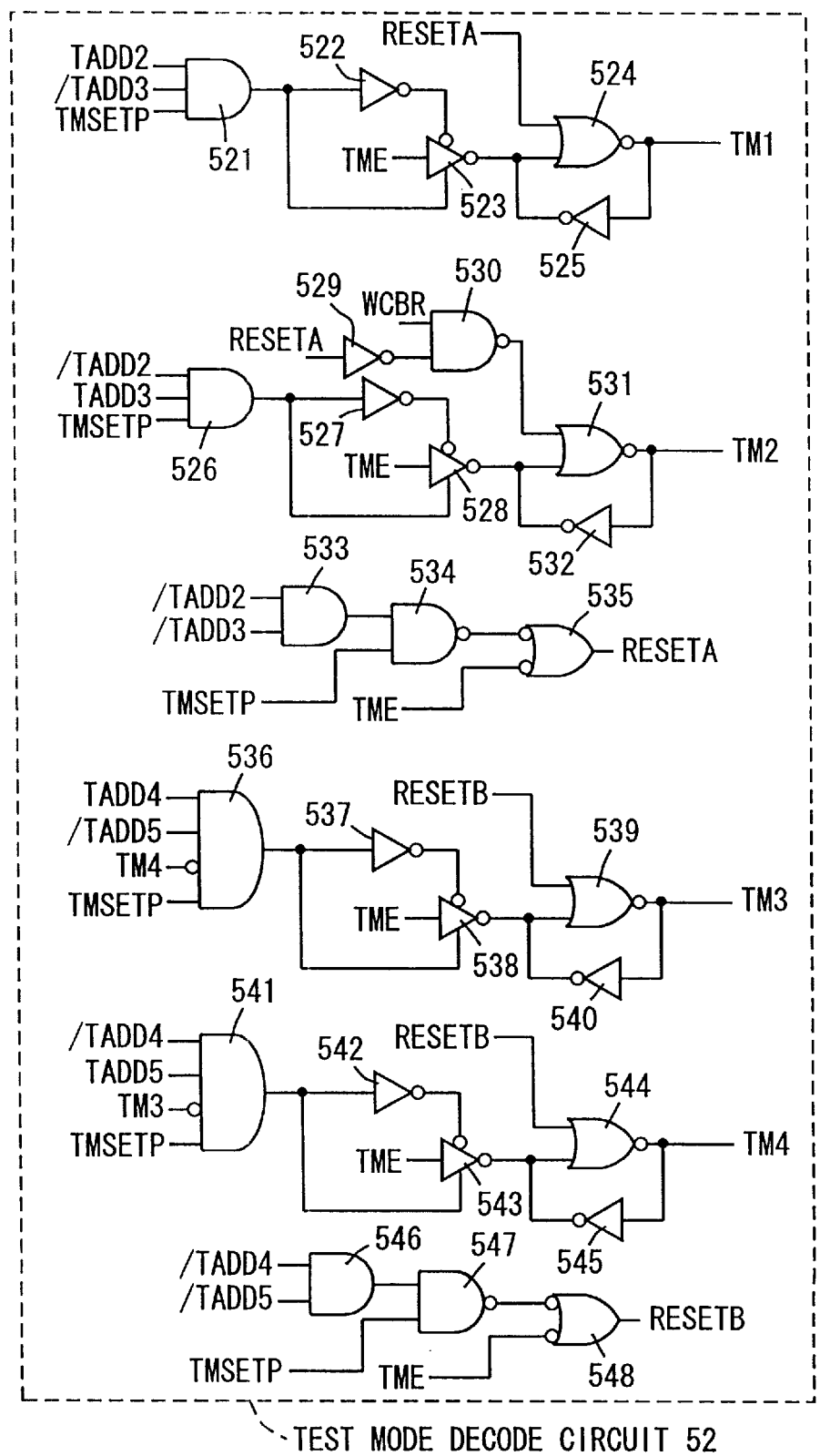
FIG. 12 is a circuit diagram showing a configuration of the FIG. 9 test mode decode circuit.

Referring to FIG. 12, test mode decode circuit 52 includes AND circuits 521, 526, 536, 541, 546, inverter circuits 522, 523, 525, 527–529, 532, 537, 538, 540, 542, 543, 545, NOR circuits 524, 531, 539, 544, and NAND circuits 530, 534, 535, 547, 578. In response to test mode address decode signals TADD2, /TADD3 and test mode setting pulse signal TMSETP, a latch circuit formed of NOR circuit 524 and inverter circuit 525 latches test mode entry signal TME and also feeds a test mode signal TM1.

Furthermore, in response to test mode address decode signals /TADD2, TADD3 and test mode setting pulse signal TMSETP, a latch circuit configured of NOR circuit 531 and inverter circuit 532 latches test mode entry signal TME and also feeds a test mode signal TM2.

A reset signal RESETA is produced in response to test mode address decode signals /TADD2, /TADD3, test mode setting pulse signal TMSETP, and test mode entry signal TME. The latch circuit configured of NOR circuit 524 and inverter circuit 525 is reset in response to reset signal RESETA. The latch circuit configured of NOR circuit 531 and inverter circuit 532 is reset when WCBR detection signal WCBR is low or reset signal RESETA is high.

Furthermore, in response to test mode address decode signals TADD4, /TADD5, a test mode signal TM4 and test mode setting pulse signal TMSETP, a latch circuit configured of NOR circuit 539 and inverter circuit 540 latches test mode entry signal TME and also feeds a test mode signal TM3.

Furthermore, in response to test mode address decode signals /TADD4, TADD5, test mode signal TM3 and test mode setting pulse signal TMSETP, a latch circuit configured of NOR circuit 544 and inverter circuit 545 latches test mode entry signal TME and also feeds test mode signal TM4.

A reset signal RESETB is produced in response to test mode address decode signals /TADD4, /TADD5, test mode setting pulse signal TMSETP and test mode entry signal TME. The latch circuit configured of NOR circuit 539 and inverter circuit 540 is reset in response to reset signal RESETB. The latch circuit configured of NOR circuit 544 and inverter circuit 545 is reset in response to reset signal RESETB.

In the above DRAM, test mode decision circuit 26 operates as described below.

Table 1 provides address keys input in the WCBR cycle to set various modes of operation.

TABLE 1

| LEVEL AT WCBR | TIME | TMSET (TM1) | TMSET (TM2) | TMSET (TM3) | TMSET (TM4) | WCBR REFRESH |
|---|---|---|---|---|---|---|
| EXT A0 | H | L | L | L | L | H |
| EXT A1 | SVIH | SVIH | SVIH | SVIH | SVIH | * |
| EXT A2 | * | H | L | * | * | * |
| EXT A3 | * | L | H | * | * | * |
| EXT A4 | * | * | * | H | L | * |
| EXT A5 | * | * | * | L | H | * |

*: Don't care

When in a WCBR cycle a high level is applied as external address signal EXTA0 and a super VIH level is also applied as external address signal EXTA1, test mode entry signal TME goes high and the DRAM is allowed for entry to a test mode, although it hasn't yet entered any test mode.

When again in a WCBR cycle a low level is applied as external address signal EXTA0 and a super VIH level is also applied as external address signal EXTA1, test mode set signal TMSET goes high and the DRAM responds to an address key of external address signals EXTA2–EXTA5 to enter a test mode as desired. More specifically, when a high level is applied as external address signal EXTA2 and a low level is also applied as external address signal EXTA3, test mode signal TM1 goes high and test control circuit 281 runs a predetermined test. When a low level is applied as external address signal EXTA2 and a high level is also applied as external address signal EXTA3, test mode signal TM2 goes high and test control circuit 282 runs a predetermined test. When a high level is applied as external address signal EXTA4 and a low level is also applied as external address signal EXTA5, test mode signal TM3 goes high and test control signal 283 runs a predetermined test. When a low level is applied as external address signal EXTA4 and a high level is also applied as external address signal EXTA5, test mode signal TM4 goes high and test control circuit 284 runs a predetermined test.

It should be noted that when in the WCBR cycle a high level is applied as external address signal EXTA0, row-related control circuit 36 refreshes memory cell array 10.

Figure 13:
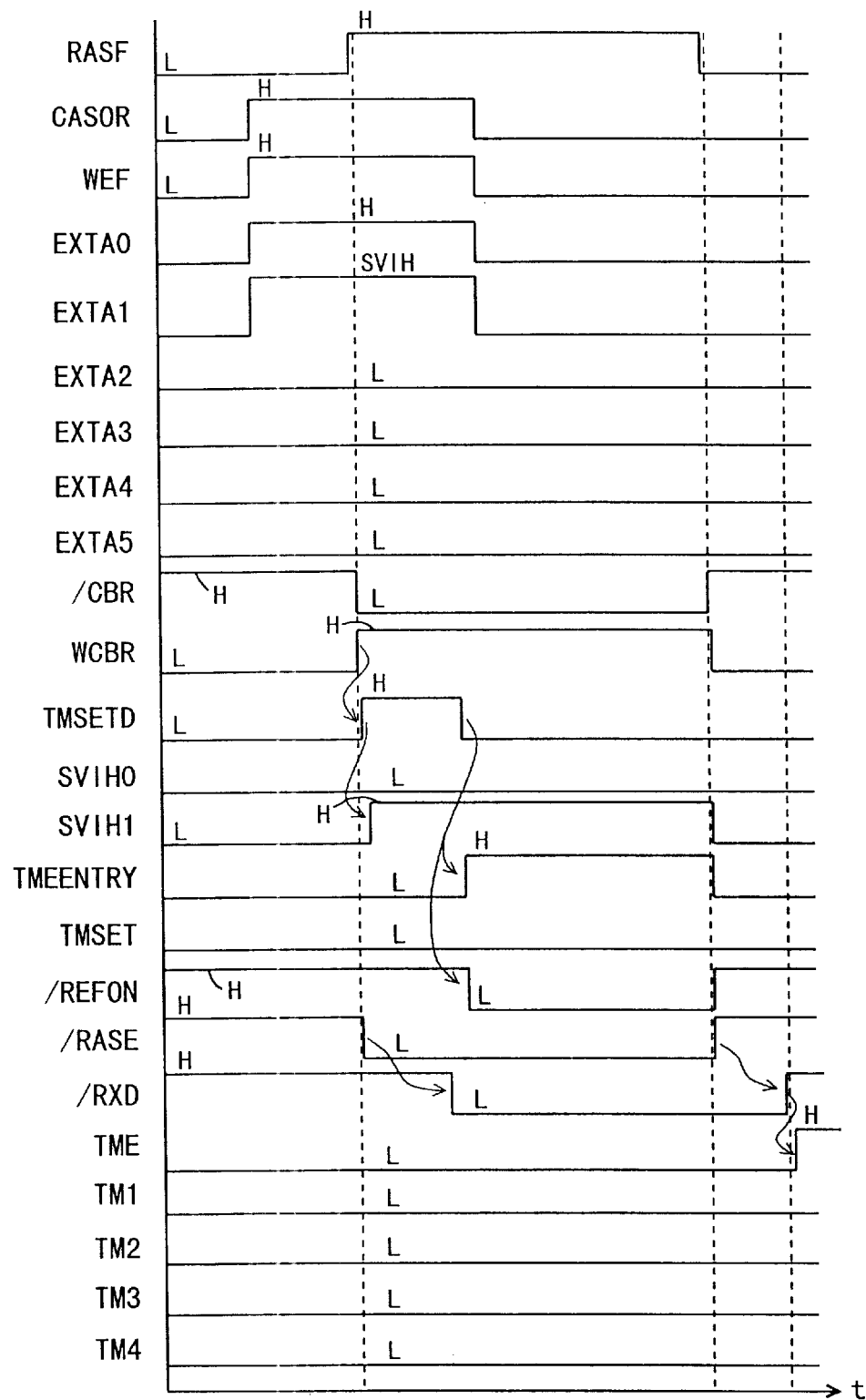
FIG. 13 is timing plots representing a test mode entry operation of the DRAM shown in FIGS. 1–12.

Referring now to FIG. 13 a test mode entry operation will be described. External address signal EXTA0 is set high and external address signal EXTA1 is set at the super VIH level, and a WCBR cycle is run.

When row address strobe signal RASF is driven high or activated in the WCBR cycle, row-related operation start control circuit 34 sets low or activates CBR detection signal /CBR and test mode entry WCBR detection circuit 43 also sets high or activates WCBR detection signal WCBR.

When WCBR detection signal WCBR is set high, one-shot multivibrator circuit 380 sets detector enable signal TMSETD high for a predetermined period of time. When detector enable signal TMSETD goes high, SVIH detectors 381 and 382 both start to operate. Since only external address signal EXTA1 attains the super VIH level, only super VIH detection signal SVIH1 goes high and super VIH detection signal SVIH0 remains low.

While detector enable signal TMSETD is held high, a gate corresponding to clocked inverter 405 opens and transfers a signal output from NAND circuit 404 to a latch circuit configured of NAND circuit 406 and inverter circuit 407. Since super VIH detection signal SVIH0 is held low and super VIH detection signal SVIH1 is held high and internal address signal /INTA0 is held low, NAND circuit 404 thus outputs a low level signal.

When detector enable signal TMSETD is driven low, the gate corresponding to clocked inverter circuit 405 is closed and the gate corresponding to NAND circuit 409 in contrast opens. Thus, a latched signal is transferred via NAND circuit 409 and test mode entry signal TMEENTRY thus goes high.

It should be noted that not only super VIH detection signal SVIH1 but also super VIH detection signal SVIH0 are detected; it is hardly only address signal EXTA1 that has a high voltage noise and such a noise should not be erroneously recognized as the super VIH.

With test mode entry signal TME held low, when row address strobe signal RASF goes high, row-related operation start control circuit 34 drives low or activates row-related operation start signal /RASE. When row-related operation start signal /RASE is driven low, row-related control circuit 36 starts to operate, and following a predetermined period of time, sense amplifier drive signal /RXD is driven low or activated. In response to the low-level sense amplifier drive signal /RXD, a sense amplifier operates an thus amplifies slight potential difference caused on paired bit lines.

When row address strobe signal RASF is subsequently driven low, row-related operation start signal /RASE is driven high or inactivated and sense amplifier drive signal /RXD is then also driven high or inactivated. When associated with row-related operation start signal /RASE inactivated the FIG. 8 word line drive signal RXT is inactivated a word line falls and a sense amplifier then responds to the high-level sense amplifier drive signal /RXD and is thus inactivated.

When sense amplifier drive signal /RXD is driven high or inactivated, in the FIG. 6 test mode entry WCBR detection circuit 43 the gate corresponding to clocked inverter circuit 458 opens. The flip flop circuit configured of NAND circuits 453 and 454 responds to the high-level test mode entry signal TMEENTRY by holding an output node NA high. Thus, a high level signal at node NA is transferred via clocked inverter circuit 458 and test mode entry signal TME thus goes high. Thus, test mode entry signal TME goes high after row address strobe signal RASF is driven low or inactivated and a sense amplifier is also inactivated. This operation is provided to prevent faults when the DRAM suddenly exits a test mode with the row system operating in the CBR cycle, the ROR (RAS Only Refresh) cycle or other cycles, although it does not cause any inconvenience at the above-described test mode entry.

As has been described above, in the WCBR cycle with external address signal EXTA0 set high and external address signal EXTA1 set at the super VIH level, test mode entry circuit 30 drives high or activates test mode enable signal TME. This allows test mode set circuit 32 to set a test mode, although any of test mode signals TM1–TM4 has not yet been driven high or activated.

Figure 14:
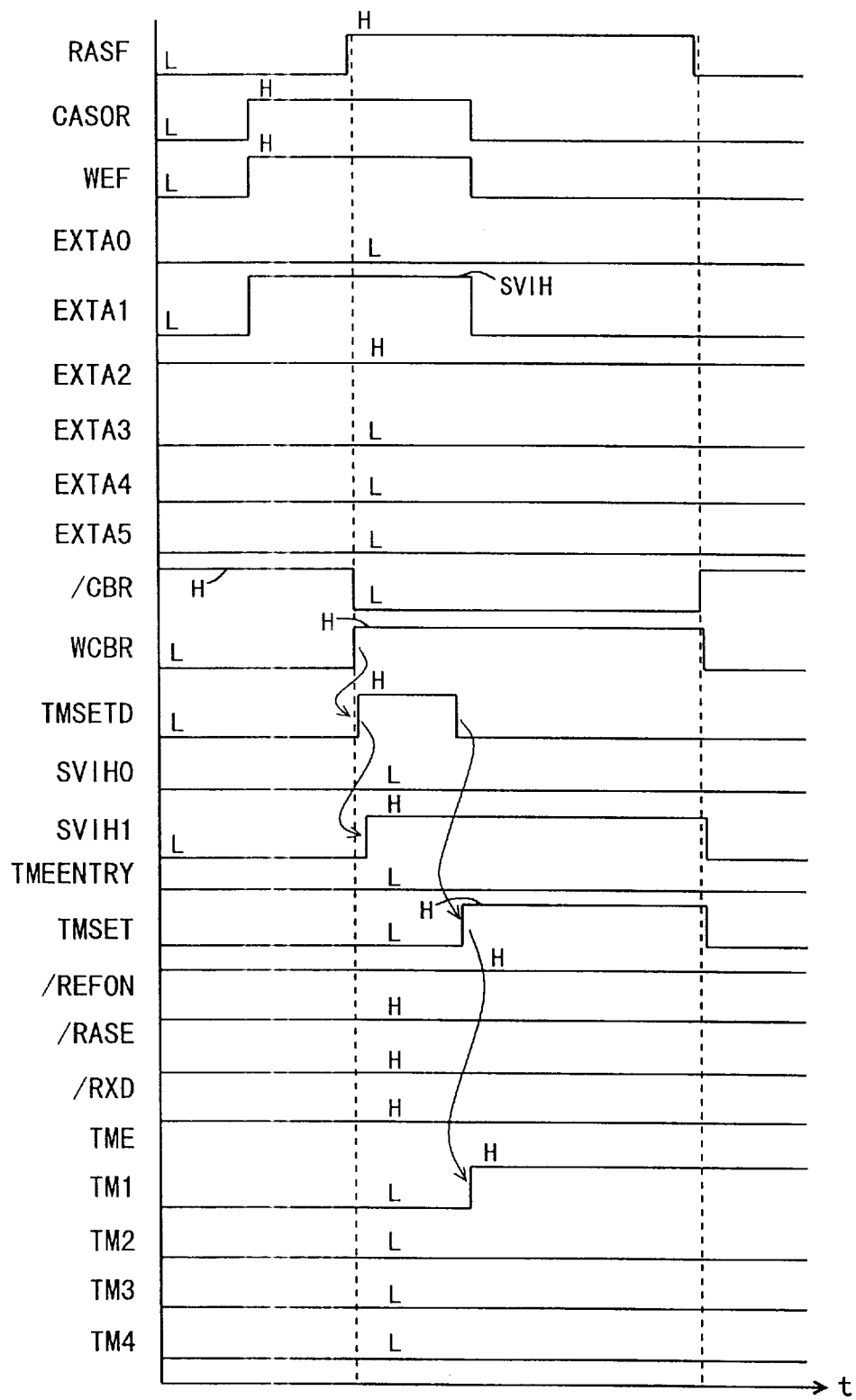
FIG. 14 is timing plots representing an operation setting one test mode after the FIG. 13 test mode entry operation.

Referring now to FIG. 14 the operation will be described of setting test mode signal TM1 high in a second WCBR cycle after test mode entry signal TME goes high.

As provided in Table 1 above, to set test mode signal TM1, external address signal EXTA2 must be set high and external address signal EXTA3 must be set low.

During a period of time with external enable signal TMSETD held high, in the FIG. 5 test mode entry address decode circuit 40 the latch circuit configured of NAND circuit 418 and inverter circuit 419 latches a low-level signal. Then, when detector enable signal TMSETD is driven low the gate corresponding to NAND circuit 421 opens and test mode set signal TMSET goes high.

In the FIG. 7 row-related operation start control signal 34, because of the WCBR cycle WBR detection signal /WBR and CBR detection signal /CASBR are both held low. Thus NOR circuit 347 outputs a high level signal. Furthermore, test mode enable signal TME is held high. Furthermore, in the FIG. 5 test mode entry address decode circuit 40 the inverter 414 output node NB is held low and refresh-on signal /REFON is thus held high. Thus, in the FIG. 7 row-related operation start control circuit 34 the 3-input NAND circuit 348 output node NC is driven low. As such, if row address strobe signal /RASF is driven high or activated, row-related operation start signal /RASE is not driven low or activated.

Furthermore, in the FIG. 5 test mode entry address decode circuit 40, external address signal EXTA0 is held low and internal address signal /INTA0 is thus held high. As such, if detector enable signal /TMSETD is driven low, refresh-on signal /REFON remains high and is thus not activated. Thus, in the FIG. 7 row-related operation start control circuit 34 the NAND circuit 348 output node NC remains low and row-related operation start signal /RASE also remains high and is thus not activated. Thus, if to set a test mode WCBR is again input, row-related operation start signal /RASE is not activated and row-related control circuit 36 thus does not operate, and as a result a refresh operation is neither performed.

Then, when test mode set signal /TMSET goes high, the FIG. 9 test mode set circuit 32 starts to operate, and in the FIG. 10 test mode setting pulse generation circuit 48 delay circuit 481 generates a high-level test mode setting pulse signal for a predetermined period of time. Furthermore, in the FIG. 11 test mode address decode circuit 50, with test mode entry signal TME held high, internal address signal INTAn is decoded into test address decode signals TADD, /TADD. In the FIG. 12 test mode decode circuit 52, test address decode signals TADD2, /TADD2–TADD5, /TADD5 are decoded and test mode signals TM1–TM4 are set. Since external address signal A2 is high and external address signal EXTA3 is low, test address decode signals TADD2 and /TADD3 both go high and test mode signal TM1 is set high. When test mode signal TM1 go high, test control circuit 281 immediately runs a test. As has been described above, in setting a test mode, row-related control circuit 36 does not operate, and the test thus can be run reliably.

Figure 15:
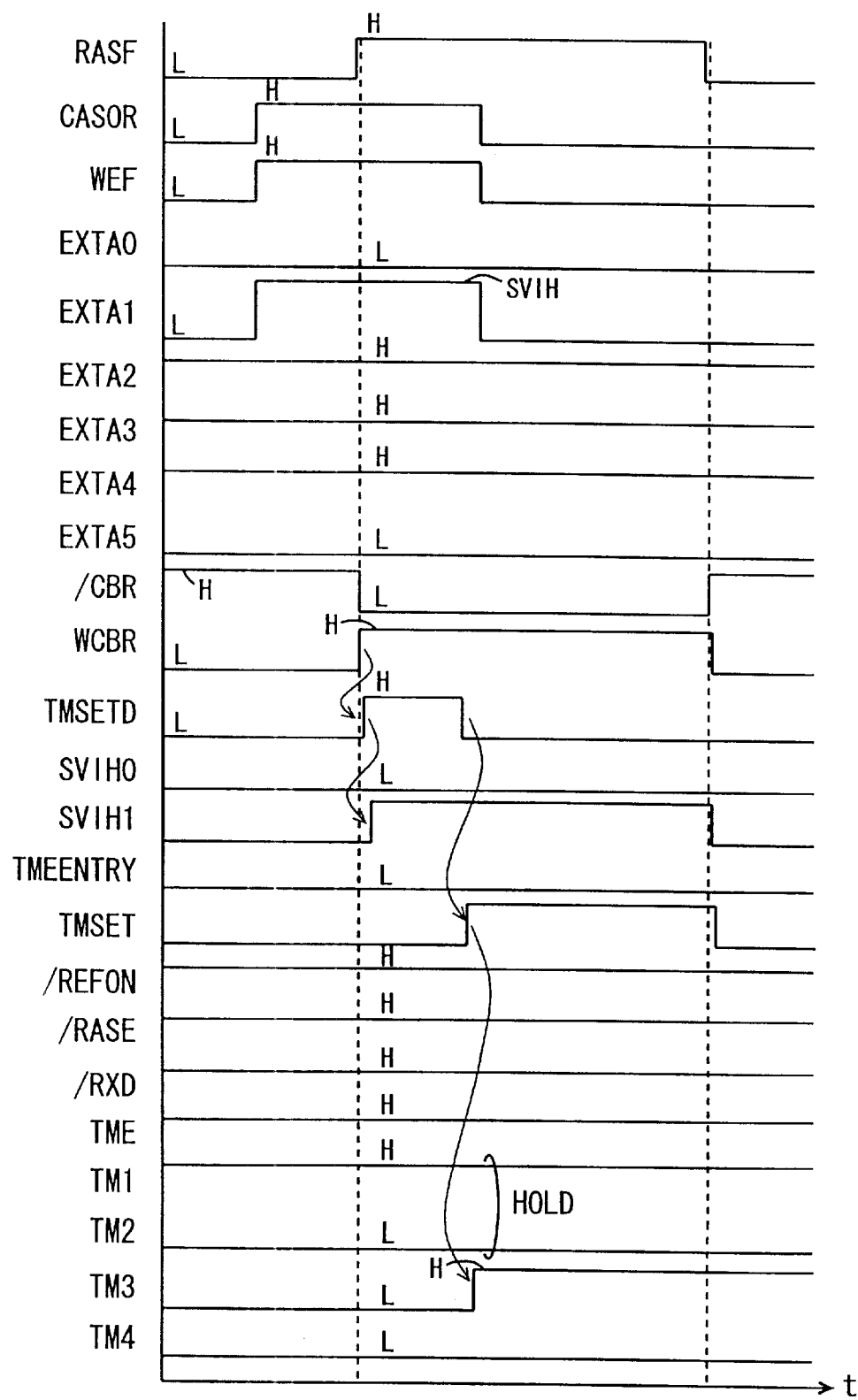
FIG. 15 is timing plots representing an operation additionally setting another test mode after the FIG. 14 test mode set operation.

Referring now to FIG. 15, the operation will be described of additionally setting test mode signal TM3 after test mode signal TM1 is set. As provided in Table 1 above, to set test mode signal TM3, external address signal EXTA4 must be set low and external address signal EXTA5 must be set high.

It should be noted that test mode signals TM1–TM4 are grouped into groups A and B. Test mode signals TM1 and TM2 belong to group A and test mode signals TM3 and TM4 belong to group B. A test mode belong to group A and a test mode belong group B can be set in parallel.

Table 2 provides address keys for holding or resetting groups A and B. To maintain the group A test mode signals TM1 and TM2 as they have already been set, external address signals EXTA2 and EXTA3 are both set high. To reset the group A test mode signals TM1 and TM2, external address signals EXTA2 and EXTA3 are both set low. To maintain the group B test mode signals TM3 and TM4 as they have already been set, external address signals EXTA4 and EXTA5 are both set high. To reset the group B test mode signals TM3 and TM4, external address signals EXTA4 and EXTA5 are both set low.

TABLE 2

| LEVEL AT WCBR | GROUP A HOLD | GROUP A RESET | GROUP B HOLD | GROUP B RESET |
|---|---|---|---|---|
| EXT A0 | L | L | L | L |
| EXT A1 | SVIH | SVIH | SVIH | SVIH |
| EXT A2 | H | L | * | * |
| EXT A3 | H | L | * | * |
| EXT A4 | * | * | H | L |
| EXT A5 | * | * | H | L |

*: Don't care

In this operation, external address signals EXT2 and EXTA3 are both set high to hold test mode signal TM1 high.

Since external address signal EXTA4 is high and external address signal EXTA5 is low, test address decode signals TADD4 and /TADD5 both go high and test mode signal TM3 is set high. Furthermore, since external address signals EXTA2 and EXTA3 are both high, the FIG. 12 test mode decode circuit 52 does not change test mode signal TM1 or TM2, that is, test mode signal TM1 remains high and test mode signal TM2 remains low.

Thus, test mode set circuit 32 continues to activate test mode signal TM1 and also activates another test mode signal TM3. Thus, without resetting a test mode more than one test mode can be set simultaneously.

Figure 16:
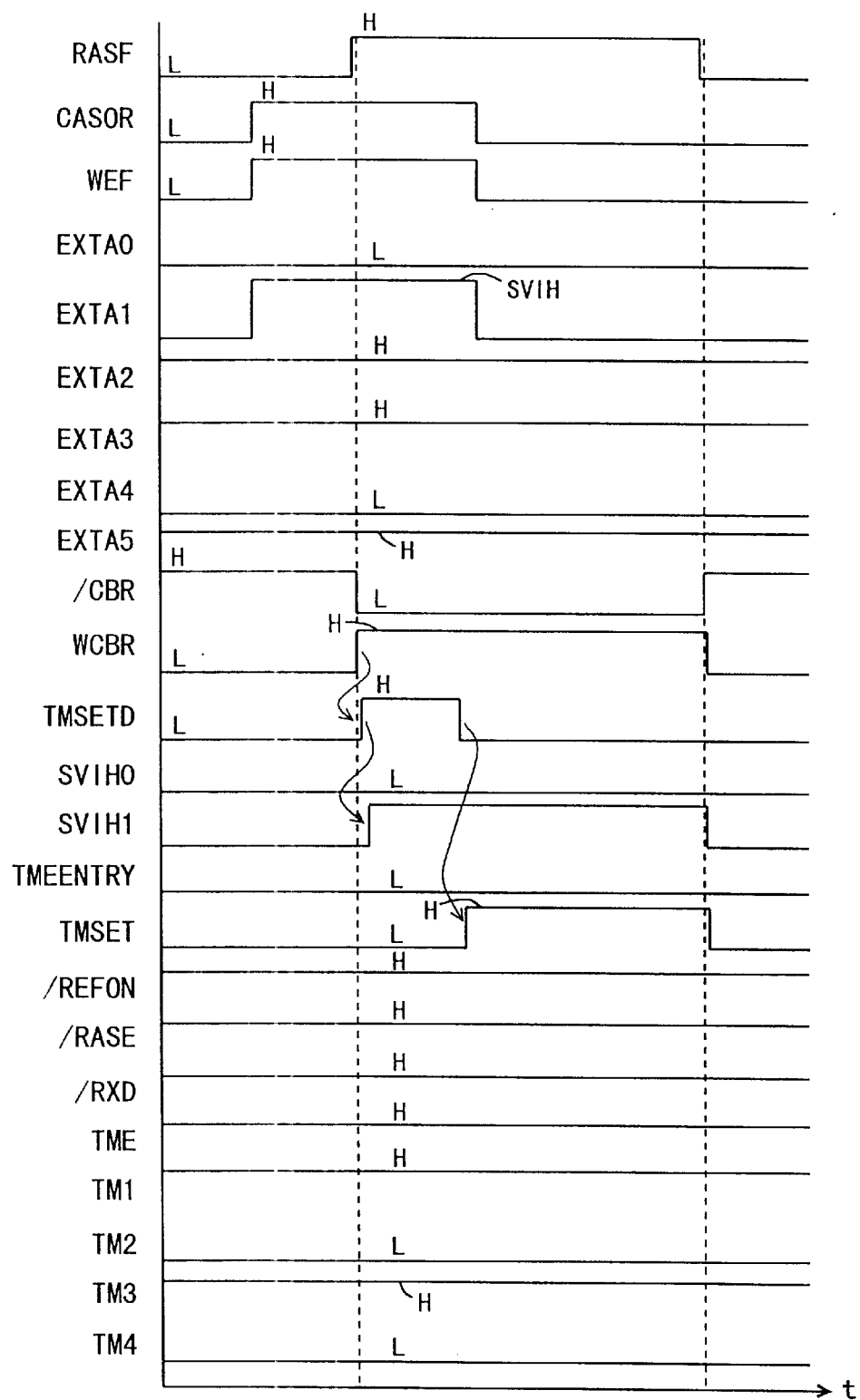
FIG. 16 is timing plots representing an operation performed when after the FIG. 15 test mode set operation an exclusive test mode is set.

Referring now to FIG. 16, the operation will be described of additionally setting test mode signal TM4 again in a WCBR cycle after test mode signals TM1 and TM3 are set. As is provided in Table 1, to set test mode signal TM4, external address signal EXTA4 must be set low and external address signal EXTA5 must be set high. External address signal EXTA2 and EXTA3 are both set high to hold a test mode of group A as it is.

When the FIG. 5 test mode entry address decode circuit 40 drives high or activates test mode set signal TMSET and responsively the FIG. 10 test mode setting pulse generation circuit 48 generates high-level test mode setting pulse signal TMSETP, in the FIG. 12 test mode decode circuit 52 at 4-input AND 541 test address decode signals /TADD4, TADD5 and test mode setting pulse signal TMSETP all go high. However, since test mode signal TM3 is set high, AND circuit 541 outputs a low-level signal. Thus, test mode signal TM4 remains low and is thus not set high.

Thus, if test mode signal TM3 has already been set, then test mode signal TM4 is not set subsequently. If test mode signal TM4 has already been set, then test mode signal TM3 is not set subsequently. They are applied to exclusive test modes which cannot be run simultaneously. For example, test control circuit 283 activated in response to test mode signal TM3 may run a test applying a substrate voltage VBB via output enable signal /OE pin 18, and test control circuit 284 activated in response to test mode signal TM4 may run a test applying a bit-line potential VBL (VCC/2) via output enable signal /OE pin 18. If the substrate voltage application test mode has already been set, then the bit-line potential application test mode is not set subsequently.

To set test mode signal TM4, the group to which test mode signal TM4 belongs or group B may be reset or the test mode may be entirely reset to first reset test mode signal TM3 low and then test mode signal TM4 may be set high.

Thus, test mode set circuit 32 prohibits setting a test mode for running a test which must not be run simultaneously with a test being run in response to a test mode signal having been set.

Figure 17:
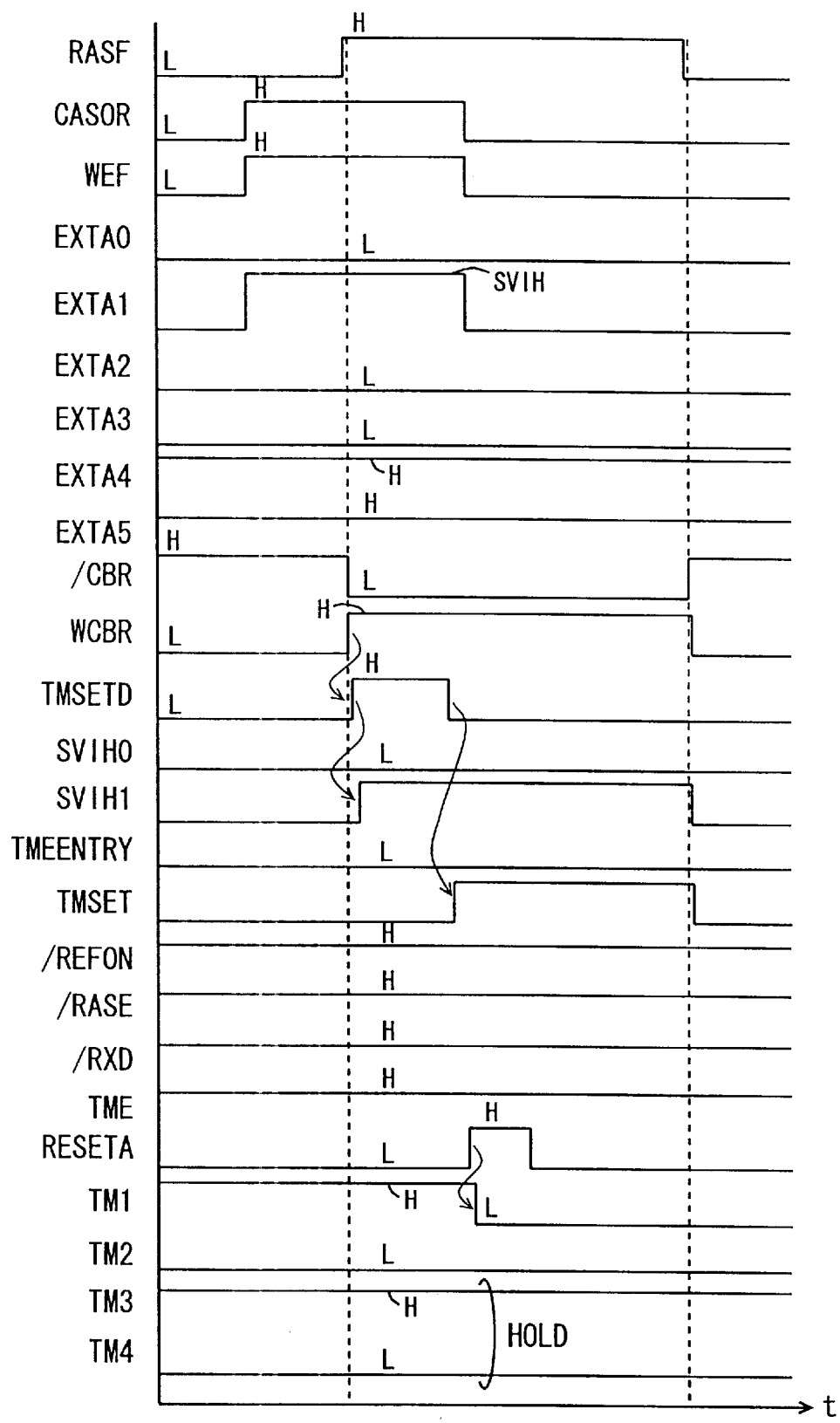
FIG. 17 is timing plots representing an operation which after the FIG. 15 test mode set operation resets one group and also holds another group.

Referring now to FIG. 17, the operation will be described of resetting test mode signals TM1 and TM2 belonging to group A. As is provided in Table 2, to reset group A, external address signals EXTA2 and EXTA3 are both set low. In this operation, external address signals EXTA4 and EXTA5 are both set high to hold group B as it is. As such, in the FIG. 12 test mode decode circuit 52, with test address decode signals /TADD2 and /TADD3 both set high, in response to a high-level test mode setting pulse signal TMSETP a high-level reset signal RESETA having almost the same width as the high-level TMSETP is generated. Thus the latch circuit configured of NOR circuit 524 and inverter circuit 525 are reset and test mode signal TM1 is reset low. Test mode signal TM2, having been low, remains low. If test mode signal TM2 has been set high, test mode signal TM2 is also reset low, as described above. Since external address signals EXTA4 and EXTA5 are both set high, the group B test mode signals TM3 and TM4 remain held as they are. If external address signals EXTA4 and EXTA5 are both set low, a high-level reset signal RESETB is generated and group B is thus also reset.

Figure 18:
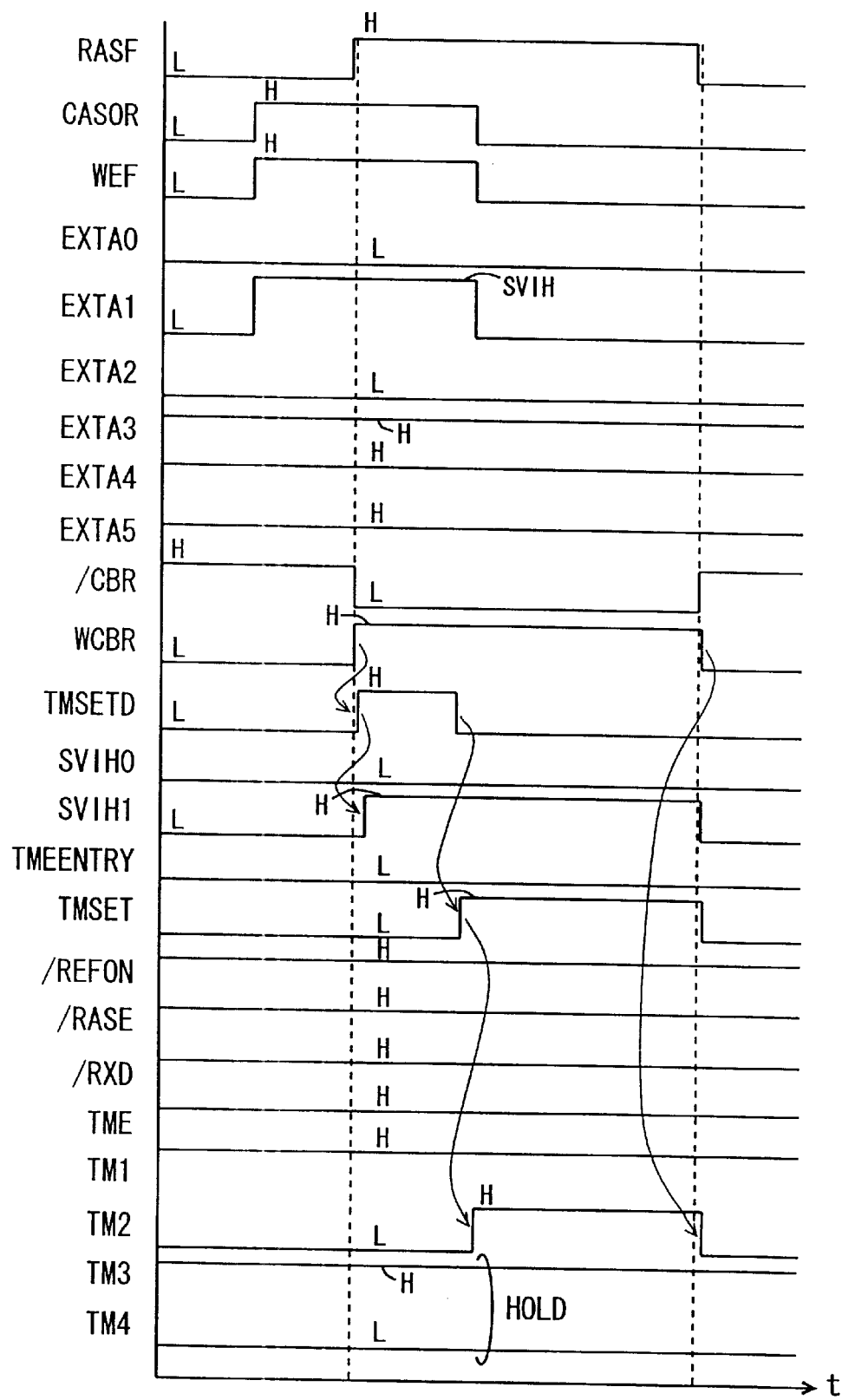
FIG. 18 is timing plots representing an operation additionally setting another test mode after the FIG. 15 test mode set operation.

Referring now to FIG. 18, the operation will now be described of additionally setting test mode signal TM2 again in a WCBR cycle after test mode signal TM1 is set. As is provided in Table 1, to set test mode signal TM2, external address signal EXTA2 must be set low and external address signal EXTA3 must be set high. In this operation, external address signals EXTA4 and EXTA5 are both set high and group B remains held as they are.

When test mode set signal TMSET goes high and a high-level test mode setting pulse signal TMSETP is generated, in the FIG. 12 test mode decode circuit 52 at 3-input AND circuit 526 test address decode signals /TADD2, TADD3 and test mode setting pulse signal TMSETP all go high. Thus test mode signal TM2 is set high and latched by the latch circuit configured of NOR circuit 531 and inverter circuit 532. The setting of test mode signal TM2, however, is different from that of test mode signals TM1, TM3, TM4. Test mode signals TM1, TM3, TM4 are not reset low if row address strobe signal RASF is only driven low or inactivated, and they are reset, with RASF inactivated, only by resetting each group or resetting a test mode. In contrast, the latch circuit latching test mode signal TM2 receives a signal output from NAND circuit 530 and thus when row address strobe signal RASF is driven low WCBR detection signal WCBR is driven low and thus NAND circuit 530 outputs a high-level signal and test mode signal TM2 is reset low.

As such, test mode signal TM2 is used when a test is run only for a period of time with row address strobe signal RASF held high, or test mode signal TM2 is used when the DRAM only exits the test mode and does not exit the other test modes. When row address strobe signal RASF is driven low, test mode signal TM2 is reset without depending on the group, and the DRAM can exit the test mode.

Test mode signal TM2 is effective when sense amplifier activation is controlled by a test mode. In the FIG. 6 test mode entry circuit 43 a signal output from 2-input NAND circuit 431 is used to determine the WCBR cycle. For a sense amplifier activation test mode, sense amplifier drive signal /RXD is held low until the DRAM exits a test mode. Unless sense amplifier drive signal /RXD goes high, NAND circuit 431 does not output a low-level signal. As such, with the DRAM in the test mode, WCBR detection signal WCBR is not generated. Using sense amplifier drive signal /RXD as an input to NAND circuit 431, as described above, contemplates avoiding the WCBR state attributed to a low-level pulse introduced into row address strobe signal RASF in a basic write operation. This means that once a DRAM has entered the sense amplifier activation test mode, WCBR detection signal WCBR is not generated, so that a test mode cannot further be set, and a test mode cannot be reset for each group.

In addition to the above, if the CBR cycle or the ROR cycle is run to reset a test mode, in the FIG. 6 test mode entry circuit 43 node NA is set low, while clocked inverter circuit 458 does not operate unless row address strobe signal RASF is driven low and sense amplifier drive signal /RXD is also driven high. Since sense amplifier drive signal /RXD has been fixed low by the test mode, test mode entry signal TME cannot transition from high to low. In other words, with this circuit, the provision of the sense amplifier activation test mode would result in any operation being locked with respect to the test mode once the test mode is entered. With a FIG. 12 test mode signal TM2 set circuit used for such a test mode, row address strobe signal RASF driven low resets test mode signal TM2 low, and sense amplifier activation signal /RXD would not be fixed low, so that the disadvantage as described above can be avoided.

Figure 19:
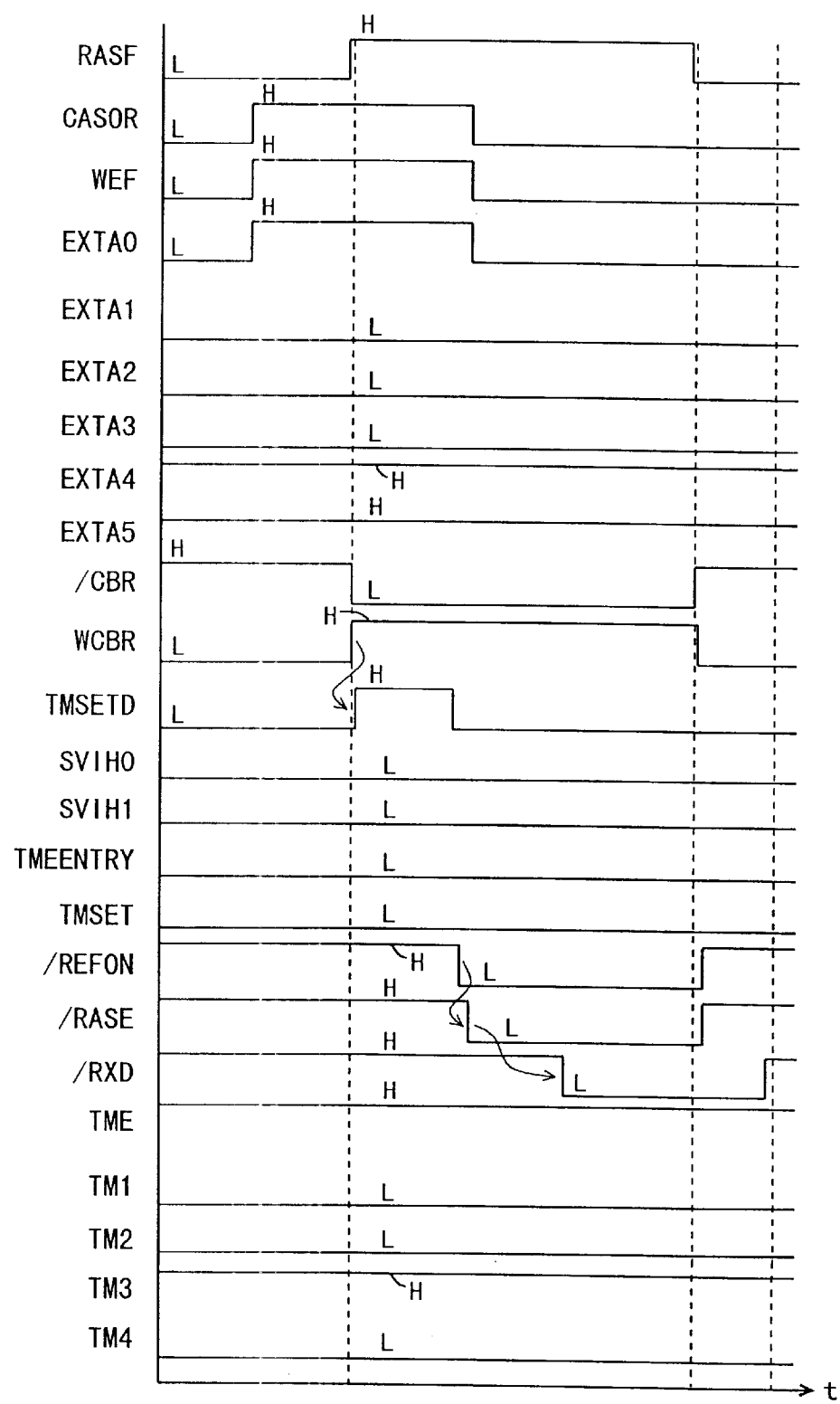
FIG. 19 is timing plots representing a CBR refresh operation performed in a test mode.

Referring now to FIG. 19, the method will be described of performing a CBR refresh operation in a test mode or while test mode enable signal TME is held high. To perform the CBR refresh operation in the test mode a WCBR refresh operation is used. As is provided in Table 1, to perform the WCBR refresh operation, external address signal EXTA0 is required to be set high. The other external address signals EXTA1–EXTA5 may each be set at any level.

In the FIG. 7 row-related operation start control circuit 34 with detector enable signal TMSETD held high, node NC is held low, and row-related operation start control signal /RASE is high so that row-related control circuit 36 does not operate. However, when at completion of the SVIH detectors 381, 382 operation detector enable signal TMSETD is driven low, in the FIG. 5 test mode entry address decode circuit 40, with internal address signal /INTA0 held low, node NB goes high, and after detector enable signal /TMSETD goes high refresh-on signal /REFON is driven low. Thus, the FIG. 7 row-related operation start control circuit 34 node NC goes high and, with row address strobe signal RASF held high, row-related operation start control signal /RASE is driven low and row-related control circuit 36 starts to operate. Since CBR detection signal /CBR generated in the CBR cycle is also low, the CBR refresh operation is performed. Since internal address signal /INTA0 is also low, test mode set signal TMSET is low and the test mode would not be set. If external address signal EXTA1 has the super VIH level, test mode entry signal TMEENTRY would go high. However, test mode entry signal TME has been high and it is thus held as it is. Thus the operation is provided properly and the above-described CBR operation is normally performed.

Figure 20:
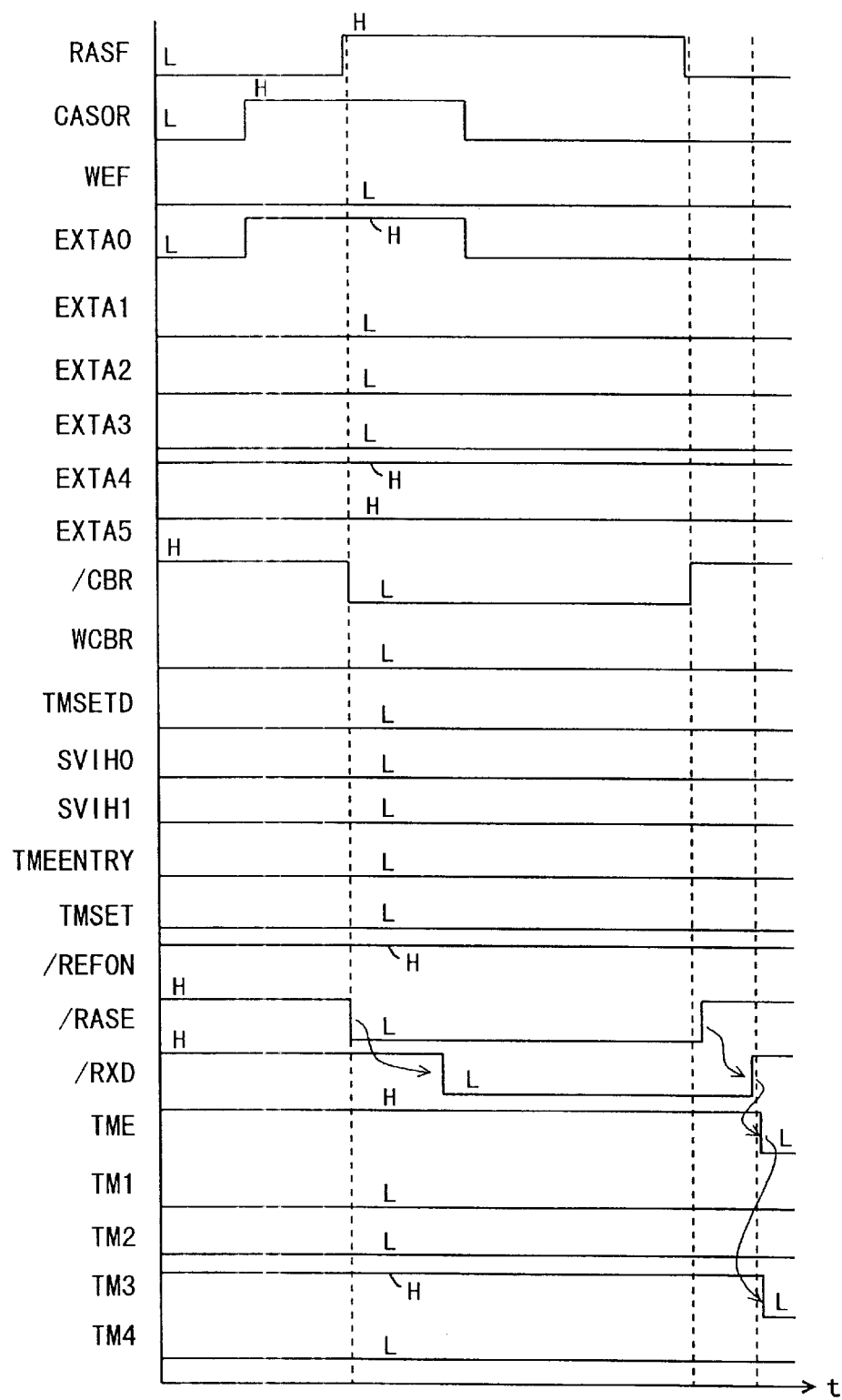
FIG. 20 is timing plots representing an operation of the FIGS. 1–12 DRAM exiting a test mode in a CBR cycle.

Referring now to FIG. 20, the operation will be described of resetting a test mode in the CBR cycle. In the FIG. 6 test mode entry circuit 43, write enable signal WEF is low and thus WBR detection signal /WBR is driven high and WCBR detection signal WCBR is driven low. In the FIG. 7 row-related operation start control circuit 34 with column address strobe signal CASOR held high, row address strobe signal RASF transitions from low to high and thus CBR detection signal /CASBR is driven low and CBR detection signal /CBR is driven low. Thus in the FIG. 6 test mode entry circuit 43 NAND circuit 440 outputs a low-level signal and CBR detection signal /CBROR is driven low. Thus node NA is driven low and latched by the latch circuit configured of NAND circuits 453 and 454. In the FIG. 7 row-related start control circuit 34, with WBR detection signal /WBR held high, node NC goes high and row-related operation start control signal /RASE is driven low in synchronization with row address strobe signal RASF. Thus row-related control circuit 36 performs the CBR refresh operation. Thereafter, when row address strobe signal RASF is driven low and row-related operation start control signal /RASE is driven high and sense amplifier drive signal /RXD is then driven high, the low level at the FIG. 6 node NA is transferred via clocked inverter circuit 458 and test mode entry signal TME is thus driven low. Thus in the FIG. 12 test mode decode circuit 52 reset signals RESETA and RESETB are both driven high and as a result all test mode signals TM1–TM4 are driven low. Thus the DRAM in the CBR cycle can exit any test modes in which the DRAM is placed.

Thus, in accordance with one embodiment of the present invention, test mode decision circuit 26 in the first WCBR cycle responds to an address key by activating test mode entry signal TME and in the second WCBR cycle with test mode entry signal TME activated responds to address key by selectively activating test mode signal TM1–TM4. As such, in order for a DRAM to enter a test mode, WCBR must be input at least twice and the DRAM is thus less likely to erroneously enter the test mode.

Furthermore, test mode decision circuit 26 continuing to activate a test mode signal while additionally activating another test mode signal allows the DRAM to enter more than one test mode simultaneously to provide high degree of freedom in testing the DRAM. Furthermore, test mode decision circuit 26 prohibits activating a test mode signal for running a test which cannot be run simultaneously with a test being run in response to a test mode signal continuously activated and the DRAM would thus not enter mutually exclusive test modes simultaneously.

Furthermore, row-related control circuit 36 refreshes memory cell array 10 when with test mode entry signal TME inactivated, CBR is input, and row-related control circuit 36 does not refresh memory cell array 10 when with test mode entry signal TME activated, WCBR is input and a test mode set operation is entered. Thus, with a test mode set a refresh operation is not performed, preventing data from being erroneously destroyed. Furthermore, row-related control circuit 36 that with test mode entry signal TME activated in a WCBR cycle responds to an address key by refreshing memory cell array 10 can perform a refresh operation as required even during test mode entry.

Furthermore, test mode decision circuit 26 adapted to respond to an address key by inactivating test mode signals TM1 and TM2 for group A and inactivating test mode signals TM3 and TM4 for group B, can use a simple circuit configuration to reset a test mode for each group. Furthermore, test mode decision circuit 26 adapted to respond to an address key by continuing to activate test mode signals TM1 and TM2 for group A and continuing to activate test mode signals TM3 and TM4 for group B, can use a simple circuit configuration to hold a test mode for each group.

Furthermore, test mode entry address decode circuit 40 adapted to decode an address key when detector enable signal TMSETD is inactivated, can decode a stable address key and thus accurately determine a test mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory cell array, comprising:
    a test mode decision circuit activating a test mode entry signal in response to an address key when a write enable signal and a column address strobe signal are activated before a row address strobe signal is activated, and selectively activating a plurality of test mode signals in response to an address key when with the test mode entry signal activated the write enable signal and the column address strobe signal are activated before the row address strobe signal is activated; and
    a plurality of test control circuits corresponding to said plurality of test mode signals, each performing a predetermined test for said semiconductor memory device in response to a corresponding test mode signal.

2. The semiconductor memory device according to claim 1, wherein
    said test mode decision circuit activates one of said test mode signals, and continues to activate the test mode signal and also activates another test mode signal.

3. The semiconductor memory device according to claim 2, wherein
    said test mode decision circuit prohibits activating a test mode signal for performing a test not allowed to be performed simultaneously with a test being performed in response to said test mode signal continuously activated.

4. The semiconductor memory device according to claim 1, further comprising:
    refresh means for refreshing said memory cell array when with said test mode entry signal activated the write enable signal and the column address strobe signal are activated before the row address strobe signal is activated.

5. The semiconductor memory device according to claim 4, wherein
    said refresh means refreshes said memory cell array in response to an address key when with said test mode entry signal activated the write enable signal and the column address strobe signal are activated before the row address strobe signal is activated.

6. The semiconductor memory device according to claim 1, wherein
    said plurality of test mode signals are divided into a plurality of groups; and
    said test mode decision circuit inactivates the test mode signal of each of said groups in response to an address key.

7. The semiconductor memory device according to claim 6, wherein
    said test mode decision circuit continuously activates the test mode signal of each of said groups in response to an address key.

8. The semiconductor memory device according to claim 1, wherein
    said test mode decision circuit includes
        a one-shot multi-vibrator circuit activating a detector enable signal when the write enable signal and the column address strobe signal are activated before the row address strobe signal is activated,
        a high-voltage detector detecting a high voltage input as an address key in response to said detector enable signal, and
        a decode circuit decoding an address key when said detector enable signal is inactivated.

* * * * *